United States Patent
Park et al.

(10) Patent No.: US 9,633,726 B2
(45) Date of Patent: Apr. 25, 2017

(54) RESISTIVE MEMORY DEVICE, RESISTIVE MEMORY SYSTEM, AND METHOD OF OPERATING RESISTIVE MEMORY DEVICE

(71) Applicant: SAMSUNG ELECTRONICS CO., LTD., Suwon-si, Gyeonggi-do (KR)

(72) Inventors: Hyun-Kook Park, Anyang-si (KR); Chi-Weon Yoon, Seoul (KR); Yeong-Taek Lee, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 14/716,558

(22) Filed: May 19, 2015

(65) Prior Publication Data
US 2016/0118117 A1   Apr. 28, 2016

(30) Foreign Application Priority Data

Oct. 28, 2014   (KR) .................. 10-2014-0147626

(51) Int. Cl.
*G11C 13/00* (2006.01)
*G11C 11/16* (2006.01)
*G11C 11/56* (2006.01)

(52) U.S. Cl.
CPC ...... *G11C 13/0069* (2013.01); *G11C 11/1673* (2013.01); *G11C 11/1675* (2013.01); *G11C 11/1677* (2013.01); *G11C 11/1693* (2013.01); *G11C 11/56* (2013.01); *G11C 13/0002* (2013.01); *G11C 13/004* (2013.01); *G11C 13/0023* (2013.01); *G11C 13/0026* (2013.01); *G11C 13/0061* (2013.01); *G11C 13/0064* (2013.01); *G11C 13/0097* (2013.01); *G11C 2013/0088* (2013.01)

(58) Field of Classification Search
CPC . G11C 13/00; G11C 13/0064; G11C 13/0066; G11C 13/0097; G11C 13/0069; G11C 13/0023; G11C 11/1677; G11C 13/0002; G11C 11/56; G11C 11/1693; G11C 11/1675; G11C 13/0026; G11C 11/1673; G11C 13/0061; G11C 13/004; G11C 2013/0088
See application file for complete search history.

(56) References Cited

U.S. PATENT DOCUMENTS

| 6,888,773 | B2 |   | 5/2005 | Morimoto |
| 7,254,055 | B2 | * | 8/2007 | Cho ............... G11C 13/0004 365/163 |
| 7,304,885 | B2 | * | 12/2007 | Cho ............... G11C 13/0004 365/148 |

(Continued)

FOREIGN PATENT DOCUMENTS

| JP | 2009266364 | | 11/2009 |
| KR | 20130122827 | A | 11/2013 |

(Continued)

*Primary Examiner* — Vanthu Nguyen
(74) *Attorney, Agent, or Firm* — Volentine & Whitt, PLLC

(57) ABSTRACT

A method of operating a resistive memory device having a plurality of word lines and a plurality of bit lines includes selecting one or more first memory cells connected to a first bit line, selecting one or more second memory cells connected to a second bit line, and simultaneously performing a reset write operation on the first and second memory cells using a first write driver.

17 Claims, 31 Drawing Sheets

(56) References Cited

U.S. PATENT DOCUMENTS

| | | | |
|---|---|---|---|
| 7,463,511 B2* | 12/2008 | Choi | G11C 8/10 |
| | | | 365/163 |
| 7,502,251 B2* | 3/2009 | Choi | G11C 13/0004 |
| | | | 365/163 |
| 7,933,141 B2 | 4/2011 | Kajigaya et al. | |
| 7,983,065 B2 | 7/2011 | Samachisa | |
| 8,724,390 B2 | 5/2014 | Hung et al. | |
| 8,755,223 B2 | 6/2014 | Scheuerlein | |
| 8,773,887 B1* | 7/2014 | Naji | G11C 11/165 |
| | | | 365/148 |
| 2009/0168505 A1* | 7/2009 | Hanzawa | G11C 13/0004 |
| | | | 365/163 |
| 2010/0232199 A1* | 9/2010 | Maejima | G11C 8/08 |
| | | | 365/51 |
| 2011/0149667 A1 | 6/2011 | Hamzaoglu et al. | |
| 2012/0327719 A1 | 12/2012 | Lue | |
| 2013/0135923 A1* | 5/2013 | Yon | G11C 13/0004 |
| | | | 365/163 |
| 2014/0169068 A1 | 6/2014 | Lee et al. | |
| 2014/0183440 A1 | 7/2014 | Lee | |
| 2014/0241039 A1* | 8/2014 | Oh | G11C 8/08 |
| | | | 365/148 |

FOREIGN PATENT DOCUMENTS

| | | |
|---|---|---|
| KR | 20140078980 A | 6/2014 |
| KR | 20140086654 A | 7/2014 |

\* cited by examiner

RESISTIVE MEMORY DEVICE, RESISTIVE MEMORY SYSTEM, AND METHOD OF OPERATING RESISTIVE MEMORY DEVICE

CROSS-REFERENCE TO RELATED APPLICATIONS

This application claims the benefit of Korean Patent Application No. 10-2014-0147626, filed on Oct. 28, 2014, in the Korean Intellectual Property Office, the disclosure of which is incorporated herein in its entirety by reference.

BACKGROUND

The application relates to a resistive memory device, and more particularly, to a resistive memory device performing erase and verify operations, a resistive memory system, and a method of operating the resistive memory device.

As demands for high capacity and low power consumption of a memory device increase, next generation memory devices that are non-volatile and do not need refresh have been researched. The next generation memory device has a high integrity of dynamic random access memory (DRAM), a fast response of static RAM (SRAM), etc. Phase change RAM (PRAM), nano floating gate memory (NFGM), polymer RAM (PoRAM), magnetic RAM (MRAM), ferroelectric RAM (FeRAM), resistive RAM (RRAM), etc. are discussed as the next generation memory device satisfying the above requirements.

SUMMARY

The application discloses a resistive memory device having improved erase and verify operations, a resistive memory system, and a method of operating the resistive memory device.

According to an aspect of the application, there is provided a method of operating a resistive memory device having a plurality of word lines and a plurality of bit lines. The method includes selecting one or more first memory cells connected to a first bit line, selecting one or more second memory cells connected to a second bit line, and simultaneously performing a reset write operation on the first and second memory cells using a first write driver.

According to another aspect of the application, there is provided a method of operating a resistive memory device having a plurality of word lines and a plurality of bit lines. The method includes selecting two or more memory cells connected to one or more word lines or one or more bit lines and providing read results to a first sense amplifier. The read results are transferred from the selected memory cells in a direction from the word line to the bit line. The method further includes generating a verify result by simultaneously verifying the selected two or more memory cells through the first sense amplifier.

According to another aspect of the application, there is provided a method of operating a resistive memory device having a plurality of first signal lines and a plurality of second signal lines arranged crossing each other. The method includes receiving an erase request or a write request, electrically connecting a first write driver to at least two first signal lines under control of a plurality of switches arranged between the plurality of first signal lines and the first write driver, and simultaneously erasing at least two memory cells through the first write driver, in response to the erase request or the write request. The erase operation is controlled by a voltage signal provided to the first and second signal lines connected to the memory cells.

According to another aspect of the application, there is provided a resistive memory device including a memory cell array having a plurality of memory cells arranged in regions where a plurality of word lines and a plurality of bit lines intersect. A read/write circuit performs a read/write operation on the plurality of memory cells and has a plurality of write drivers. A control logic controls the plurality of memory cells connected to two or more bit lines to be selected and the selected memory cells to be simultaneously erased by using one write driver.

According to another aspect of the application, there is provided a method of simultaneously operating memory cells of a resistive memory that are each uniquely addressed by one of a plurality of first signal lines and one of a plurality of second signal lines. The method includes applying a signal to each of one or more of the first signal lines and another signal to each of two or more of the second signal lines to thereby select a plurality of resistive memory cells uniquely addressed by the one or more first signal lines and two or more second signal lines. A voltage is simultaneously applied across each of the selected memory cells.

BRIEF DESCRIPTION OF THE DRAWINGS

Exemplary embodiments of the application will be more clearly understood from the following detailed description taken in conjunction with the accompanying drawings in which.

DETAILED DESCRIPTION OF THE EMBODIMENTS

Figure 1:
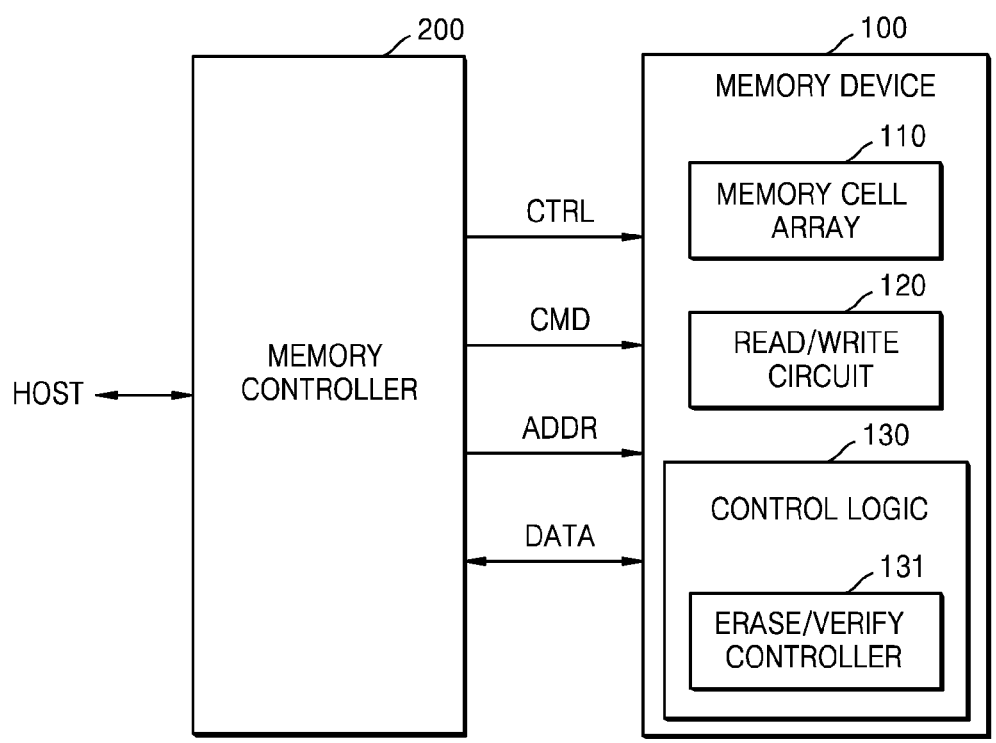
FIG. 1 is a block diagram of a memory system including a memory device according to an exemplary embodiment.

As used herein, the term "and/or" includes any and all combinations of one or more of the associated listed items. Expressions such as "at least one of," when preceding a list of elements, modify the entire list of elements and do not modify the individual elements of the list.

The present application will now be described more fully with reference to the accompanying drawings, in which embodiments of the application are shown. However, the present application is not limited thereto and it will be understood that various changes in form and details may be made therein without departing from the spirit and scope of the following claims. That is, descriptions of particular structures or functions may be presented merely for explaining exemplary embodiments of the present application. Throughout the drawings, like reference numerals denote like elements. Sizes of components in the drawings may be exaggerated for convenience of explanation.

Terms used in the present specification are used for explaining a specific exemplary embodiment, not for limiting the present application. Thus, an expression used in a singular form in the present specification also includes the expression in its plural form unless clearly specified otherwise in context. Also, terms such as "include" or "comprise" may be construed to denote a certain characteristic, number, step, operation, constituent element, or a combination thereof, but may not be construed to exclude the existence of or a possibility of addition of one or more other characteristics, numbers, steps, operations, constituent elements, or combinations thereof.

Terms such as "first" and "second" are used herein merely to describe a variety of constituent elements, but the constituent elements are not limited by the terms. Such terms are used only for the purpose of distinguishing one constituent element from another constituent element. For example, without departing from the right scope of the present application, a first constituent element may be referred to as a second constituent element, and vice versa.

Unless defined otherwise, all terms used herein including technical or scientific terms have the same meanings as those generally understood by those of ordinary skill in the art to which the present application may pertain. The terms as those defined in generally used dictionaries are construed to have meanings matching that in the context of related technology and, unless clearly defined otherwise, are not construed to be ideally or excessively formal.

FIG. 1 is a block diagram of a memory system 10 including a memory device 100 according to an exemplary embodiment. In the present exemplary embodiment, the memory device 100 may include a variety of types of memory cells. As the memory device 100 includes, for example, resistive memory cells, the memory device 100 may be referred to as the resistive memory device. Alternatively, in the present exemplary embodiment, as the resistive memory cells are arranged at regions where a plurality of first signal lines and a plurality of second signal lines intersect, the resistive memory device may be referred to as a cross-point memory device. In the following descriptions of exemplary embodiments, the memory device 100 may be assumed to be the resistive memory device.

Referring to FIG. 1, the memory system 10 may include the memory device 100, and a memory controller 200. The memory device 100 may include a memory cell array 110, a read/write circuit 120, and a control logic 130. When the memory cell array 110 includes resistive memory cells, the memory system 10 may be referred to as the resistive memory system. According to the present exemplary embodiment, the memory device 100 may perform an erase operation in units of cells or areas. Also, a verify operation to verify the erase operation may be performed. The control logic 130 may include an erase/verify controller 131 to control the erase and verify operations.

The memory controller 200, in response to a read/write request from a host HOST, may control the memory device 100 to read data stored in the memory device 100 or write data to the memory device 100. In detail, the memory controller 200 may control program or write, read, and erase operations with respect to the memory device 100 by providing an address ADDR, a command CMD, and a control signal CTRL to the memory device 100. Also, data DATA to be written and data DATA to be read may be communicated between the memory controller 200 and the memory device 100.

Although not illustrated, the memory controller 200 may include random access memory (RAM), a processing unit, a host interface, and a memory interface. RAM may be used as an operating memory of the processing unit. The processing unit may control the operation of the memory controller 200. The host interface may include a protocol to perform an exchange of data between the host Host and the memory controller 200. For example, the memory controller 200 may be configured to communicate with an external device such as the host HOST through at least one of various interface protocols such as universal serial bus (USB), multi-media card (MMC), peripheral component interconnect express (PCI-E), advanced technology attachment (ATA), Serial-ATA, Parallel-ATA, small computer system interface (SCSI), enhanced small disk interface (ESDI), integrated drive electronics (IDE), etc.

The memory cell array 110 may include a plurality of memory cells (not shown) arranged at the regions where the first signal lines and the second signal lines intersect. In one exemplary embodiment, the first signal lines may be a plurality of bit lines and the second signal lines may be a plurality of words lines. In another exemplary embodiment, the first signal lines may be a plurality of word lines and the second signal lines may be a plurality of bit lines.

Also, each of the memory cells may be a single-level cell (SLC) where one bit of data is stored or a multi-level cell (MLC) where at least two bits of data are stored. Alternatively, the memory cell array 110 may include SLC and MLC altogether. When one bit of data is written to one memory cell, the memory cells may have two resistance level distributions according to the written data. Alternatively, when two bits of data are written to one memory cell, the memory cells may have four resistance level distributions according to the written data. In another exemplary embodiment, when three bits of data are written to one memory cell, that is, a triple level cell (TLC), the memory cells may have eight resistance level distributions according to the written data. However, the present application is not limited thereto and in another exemplary embodiment, the memory cells each may store four or more bits of data.

Also, in one exemplary embodiment, the memory cell array 110 may include memory cells in a two-dimensional horizontal structure. In another exemplary embodiment, the memory cell array 110 may include memory cells in a three-dimensional vertical structure.

Alternatively, the memory cell array 110 may include resistive memory cells having variable resistance devices (not shown). For example, when the variable resistance device is formed of a phase change material such as germanium-antimony-tellurium (GST or Ge—Sb—Te) and thus resistance changes according to temperature, the resistive memory device may be a phase change RAM (PRAM). In another example, when the variable resistance device is formed of an upper electrode, a lower electrode, and a complex metal oxide interposed therebetween, the resistive memory device may be a resistive RAM (RRAM). In another example, when the variable resistance device is formed of a magnetic upper electrode, a magnetic lower electrode, and a dielectric material interposed therebetween, the resistive memory device may be a magnetic RAM (MRAM).

The read/write circuit 120 performs read and write operations with respect to the memory cells. The read/write circuit 120 may be connected to the memory cells via a plurality of signal lines, for example, bit lines, and may include a write driver to write data to the memory cells and a sense amplifier for sensing resistance components of the memory cells. As the memory cell array 110 includes the bit lines, the read/write circuit 120 may include a plurality of write drivers and a plurality of sense amplifiers corresponding thereto. For example, one write driver and one sense amplifier may be arranged corresponding to one bit line. Alternatively, as one write driver and one sense amplifier are arranged corresponding to two or more bit lines, each of the write driver and the sense amplifier may be shared by the bit lines.

The control logic 130 may control an overall operation of the memory device 100 and also may control the read/write circuit 120 to perform memory operations such as writing and reading. In an example, the memory device 100 may include a power generator (not shown) for generating various write voltages and read voltages used for the read and write operations. Levels of the write voltage and the read voltage may be adjusted under the control of the control logic 130. Also, the memory device 100 may include a reference signal generator (not shown) for generating various reference signals used for a read operation. For example, the reference signal generator may generate a reference current and/or a reference voltage. Levels of the reference current and/or the reference voltage may be adjusted under control of the control logic 130.

In the write operation of the memory device 100, a resistance value of a variable resistor of a memory cell of the memory cell array 110 may increase or decrease according to write data. For example, each of the memory cells of the memory cell array 110 may have a resistance value according to currently stored data and the resistance value may increase or decrease according to data to be written to each memory cell. The above write operation may be classified into a reset write operation and a set write operation. In the resistive memory cell, a set state may have a relatively low resistance value whereas a reset state may have a relatively high resistance value. While the reset write operation may perform a write operation in a direction in which the resistance value of the variable resistor increases, the set write operation may perform a write operation in a direction in which the resistance value of the variable resistor decreases.

As the command CMD related to various memory operations between the memory device 100 and the memory controller 200 is previously set and the command CMD is provided from the memory controller 200 to the memory device 100, the memory device 100 performs a memory operation corresponding thereto. According to the present exemplary embodiment, an erase command may be defined between the memory device 100 and the memory controller 200, and the memory device 100 may perform an erase operation on one or more memory cells in response to a command CMD indicating an erase request.

In an exemplary embodiment, an erase operation may be performed in units of cells or predetermined regions. The region of the erase unit may be variously defined, for example, the region may correspond to a page, a tile, or a cell block including a plurality of tiles. The page may be defined as a concept including a plurality of memory cells connected to the same word line. The tile may be defined in various ways, for example, as a concept including memory cells arranged at regions where a plurality of word lines sharing one row decoder and a plurality of bit lines sharing one column decoder intersect.

The erase operation according to the present exemplary embodiment may correspond to an operation of moving a resistance distribution of the memory cells to one state. For example, the erase operation may be performed by a reset write operation that increases a resistance value of the memory cells. Accordingly, the erased memory cells may have a reset state having a large resistance value. A verify operation to determine whether a write operation is normally performed with the memory cells in the reset state according to a result of the erasure may be sequentially performed. However, the present exemplary embodiment is not limited thereto and, for example, the erase operation may be performed by a set write operation that decreases the resistance value of the memory cells.

The erase operation according to the present exemplary embodiment may be performed by using another command CMD. For example, when the erase operation with respect to the memory cells is performed by reset writing, the memory controller 200 may control such that the erase operation is performed by providing write data DATA corresponding to the reset state with the write command CMD to the memory device 100.

In addition, the erase operation according to the present exemplary embodiment may be performed in various cases. In an exemplary embodiment, the memory system 10 may determine necessary the erase operation regardless of a request from the host HOST and may accordingly perform the erase operation. Similar to a free-block generation operation of a NAND flash memory, the memory system 10 may determine necessary the erase operation with respect to at least a partial area of the memory cell array 110 and control the erase operation to be performed according to a result of the determination. For example, when the erase operation is performed in units of tiles, valid data written to a tile to be erased is moved to another tile and then the erase operation may be performed on the memory cells included in the tile to be erased.

Also, in an example, the erase operation on the memory cells may be controlled to be performed during a generation write operation. For example, when a write request is received from the host HOST, the memory system 10 first performs the erase operation on the memory cells on which a write operation is actually to be performed so that all memory cells may have a reset state. After the erase operation is performed as described above, write data DATA accompanying a write command CMD is written to the memory cells. Since the memory cells have the reset state due to the erase operation, a set write operation is performed on the memory cells by the erase operation and thus the write operation may be completed.

According to the present exemplary embodiment, in performing the erase operation, two or more memory cells may be simultaneously erased. In detail, one write driver, for example, a first write driver, may simultaneously perform the erase operation on two or more memory cells. For example, the first write driver may be electrically connected to one bit line and may simultaneously perform the erase operation on the memory cells arranged in regions where one bit line and two or more word lines intersect. Alternatively, in another example, the first write driver may be electrically connected to two or more bit lines and may simultaneously perform the erase operation on the memory cells arranged in regions where two or more bit lines and at least one word line intersect.

After the above-described erase operation is performed, a verify operation may be performed with respect to the erase operation. The verify operation according to the present exemplary embodiment may also be simultaneously performed on two or more memory cells. In detail, two or more memory cells electrically connected to one sense amplifier, for example, a first sense amplifier, are simultaneously read out. The first sense amplifier may receive a result of the reading from the two or more memory cells and generate a result of the verification. According to the verification result, when one or more memory cell is not normally erased, the erase operation may be controlled to be repeatedly performed.

A method of simultaneously selecting a plurality of memory cells in the erase operation and the verify operation may be performed in various ways. For example, the memory controller 200 may directly generate an address ADDR to indicate memory cells to be erased or verified and provide a generated address ADDR to the memory device 100. Alternatively, various pieces of information related to the selection of memory cells are stored in the memory device 100 and, when the memory controller 200 provides the memory device 100 with an address ADDR indicating a cell region to be erased, the memory device 100 may directly generate an internal address indicating memory cells included in the cell region.

Alternatively, the memory controller 200 and the memory device 100 may be integrated as one semiconductor device. For example, the memory controller 200 and the memory device 100 may be integrated as one semiconductor device, forming a memory card. For example, the memory controller 200 and the memory device 100 that are integrated as one semiconductor device may form a PC card (PCMCIA), a compact flash card (CF), a smart media card (SM/SMC), a memory stick, a multimedia card (MMC, RS-MMC, or MMCmicro), an SD card (SD, miniSD, or microSD), a universal flash memory (UFS), etc. In another example, the memory controller 200 and the memory device 100 may be integrated as one semiconductor device forming a solid state disk/drive (SSD).

Figure 2:
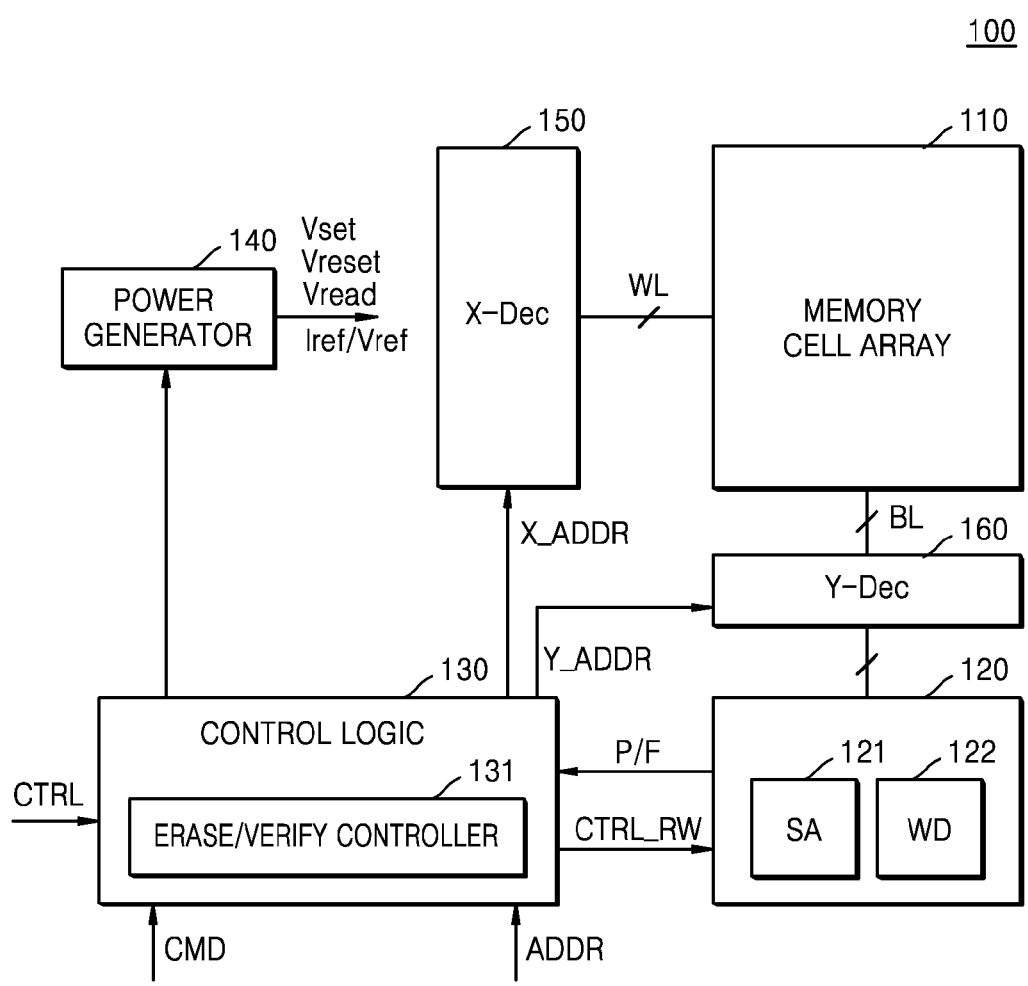
FIG. 2 is a block diagram illustrating an exemplary embodiment of the memory device of FIG. 1.

An example of a detailed operation of the memory device 100 included in the memory system 10 configured as above is shown as follows. FIG. 2 is a block diagram illustrating an example of the memory device 100 of FIG. 1.

Referring to FIG. 2, the memory device 100 may include the memory cell array 110, the read/write circuit 120, and the control logic 130. Also, the memory device 100 may further include a power generator 140, a row decoder 150, and a column decoder 160. Also, the read/write circuit 120 may include a sense amplifier 121 and a write driver 122. The control logic 130 may include the erase/verify controller 131.

An example of an operation of the memory device 100 of FIG. 2 is described as follows.

Memory cells provided in the memory cell array 110 may be connected to a plurality of first signal lines and a plurality of second signal lines. The first signal lines may be bit lines BL and the second signal lines may be word lines WL. As various voltage signals or current signals are provided through the bit lines BL and the word lines WL, data may be read from or written to selected memory cells and data reading or writing on the other non-selected memory cells may be prevented.

Alternatively, an address ADDR to indicate a memory cell to access may be received with a command CMD. The address ADDR may include a row address X_ADDR to select the word line WL of the memory cell array 110 and a column address Y_ADDR to select the bit line BL of the memory cell array 110. The row decoder 150 performs a word line selection operation in response to the row address X_ADDR. The column decoder 160 performs a bit line selection operation in response to the column address Y_ADDR.

The read/write circuit 120 being connected to the bit lines BL may write data to the memory cell or may read data from the memory cell. During the write and read operations, various voltage signals or current signals may be provided to the memory cell array 110. In an exemplary embodiment, when the memory operation is performed in a uni-polar method, a set voltage Vset and a reset voltage Vreset may be provided to the bit lines BL through the column decoder 160. In another exemplary embodiment, when the memory operation is performed in a bi-polar method, the reset voltage Vreset may be provided to the word lines WL through the row decoder 150.

Alternatively, the power generator 140 may generate a reference voltage Vref and a reference current Iref which are used for a data read operation. In another exemplary embodiment, the reference voltage Vref and the reference current Iref for data reading may be generated by other power generation units.

Also, the read/write circuit 120 may perform verify and read operations on the memory cells, generate a pass/fail signal P/F as a verify result by determining a read result of the memory cells, and provide the verify result to the control logic 130. The control logic 130 may control read, write, and verify operations of the memory cell array 110 referring to the P/F signal.

The control logic 130 may output various control signal CTRL_RW to write data to the memory cell array 110 or read data from the memory cell array 110, based on the command CMD, the address ADDR, and the control signal CTRL received from the memory controller 200. Accordingly, the control logic 130 may control various operations in the memory device 100.

According to the present exemplary embodiment, the memory device 100 may perform an erase operation on the memory cells in various cases. For example, according to an erase request from the host HOST, an erase operation may be performed in response to an erase command CMD. Also, an erase operation may be performed in response to a write command CMD which is provided from the memory controller 200. Also, according to a write request from the host HOST, an erase operation is first performed on the memory cells on which a data write operation is to be performed, and then an actual data write operation may be performed after the erase operation. Also, regardless of the request from the host HOST, the memory device 100 may be controlled to perform an erase operation.

Although FIG. 2 illustrates that the erase/verify controller 131 is embodied inside the control logic 130, the present exemplary embodiment is not limited thereto. For example, the erase/verify controller 131 may include a unit for determining whether to enter an erase mode according to a result of checking a command CMD and a unit for generating an address indicating memory cells to be erased, and at least one of the units may be embodied outside the control logic 130.

Figure 3:
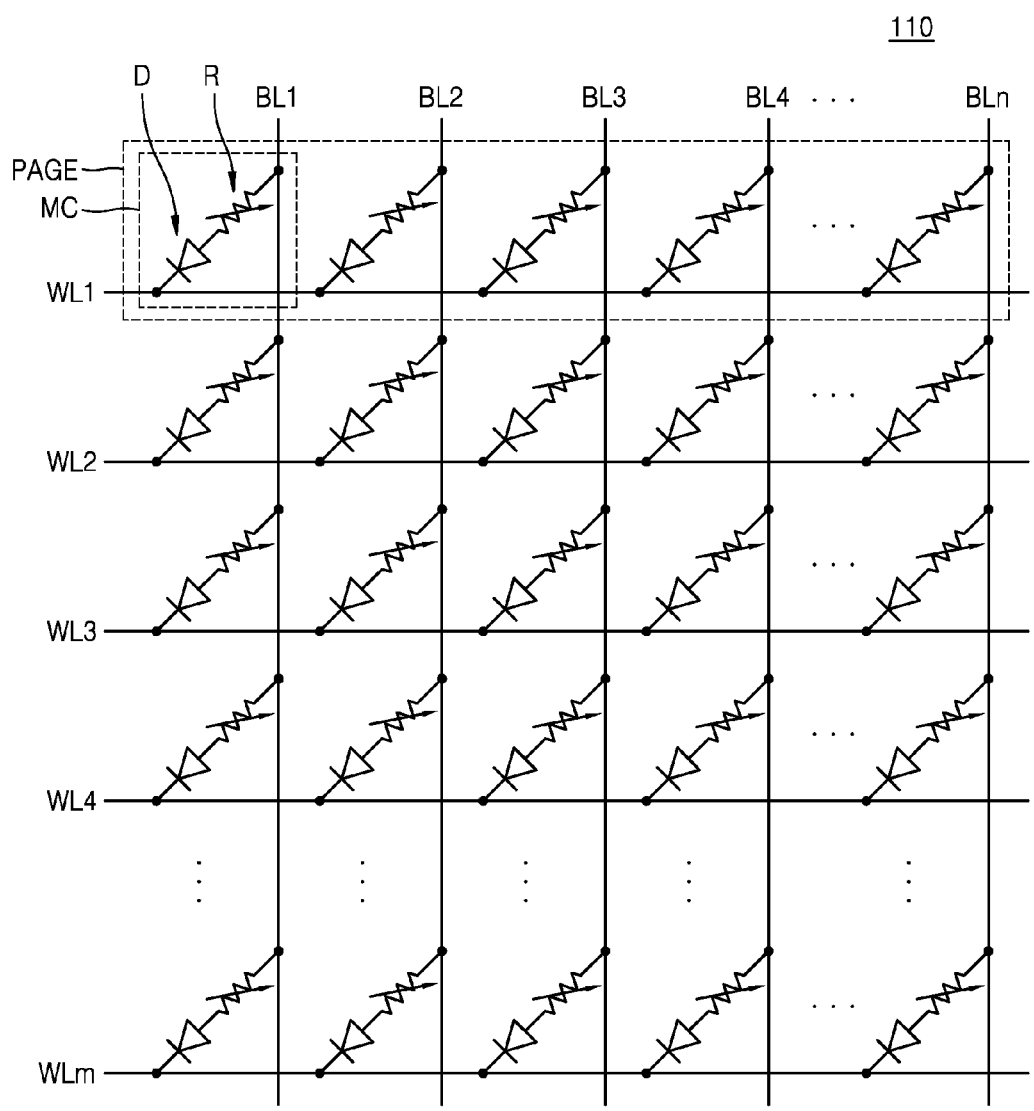
FIG. 3 is a circuit diagram illustrating an exemplary embodiment of a memory cell array of FIG. 2.

FIG. 3 is a circuit diagram illustrating an example of the memory cell array 110 of FIG. 2. The memory cell array 110 may include a plurality of cell regions and FIG. 3 illustrates one of the cell regions.

Referring to FIG. 3, the memory cell array 110 may include a plurality of word lines WL1-WLm, a plurality of bit lines BL1-BLn, and a plurality of memory cells MC. The number of the word lines WL, the number of the bit lines BL, and the number of the memory cells MC may be variously changed according to exemplary embodiments. Also, the memory cells MC connected to the same word line WL may be defined for each page.

Each of the memory cells MC may include a variable resistor R and a selective device D. The variable resistor R may be referred to as a variable resistance device or a variable resistor material, and the selective device D may be referred to as a switching device.

In one exemplary embodiment, the variable resistor R may be connected between one of the bit lines BL1-BLn and the selective device D. The selective device D may be connected between the variable resistor R and one of the word lines WL1-WLm. However, the present application is not limited thereto, and the selective device D may be connected between one of the bit lines BL1-BLn and the variable resistor R, and the variable resistor R may be connected between the selective device D and one of the word lines WL1-WLm.

The variable resistor R may vary into one of a plurality of resistance states by an applied electric pulse. In one exemplary embodiment, the variable resistor R may include a phase-change material having a crystal state that changes according to an amount of current. Various types of materials include two-element compounds such as GaSb, InSb, InSe, $Sb_2Te_3$, and GeTe, three-element compounds such as GeSbTe, GaSeTe, InSbTe, $SnSb_2Te_4$, and InSbGe, four-element compounds such as AgInSbTe, (GeSn)SbTe, GeSb(SeTe), and $Te_{81}Ge_{15}Sb_2S_2$, etc. may be used as the phase-change material.

The phase-change material may have an amorphous state having a relatively high resistance and a crystal state having a relatively low resistance. The phase-change material may have a phase that changes according to Joule's heat generated according to an amount of current. Accordingly, data may be written by using the phase change.

Alternatively, in another exemplary embodiment, the variable resistor R may include, instead of the phase-change material, perovskite compounds, transition metal oxides, magnetic materials, ferromagnetic materials, or antiferromagnetic materials.

The selective device D may be connected between one of the word lines WL1~WLm and the variable resistor R and may control a supply of current to the variable resistor R according to the voltage applied to the connected word line and bit line. In one exemplary embodiment, the selective device D may be a PN junction diode or a PIN junction diode. An anode of the diode may be connected to the variable resistor R and a cathode of the diode may be connected to one of the word lines WL1~WLm. When a voltage difference between the anode and the cathode of the diode is higher than a critical voltage of the diode, the diode may be turned on so as to supply current to the variable resistor R.

Figure 4A:
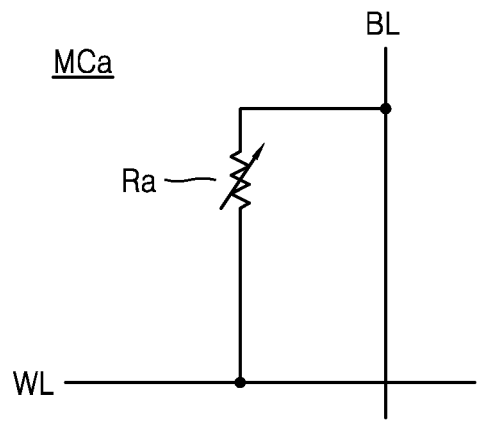
FIGS. 4A to 4C are circuit diagrams illustrating modified examples of the memory cell of FIG. 3.
Figure 4B:
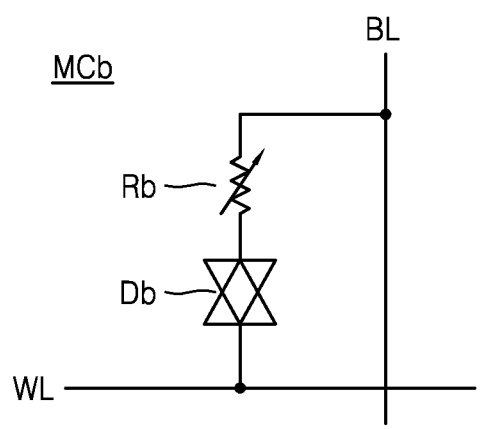
Figure 4C:
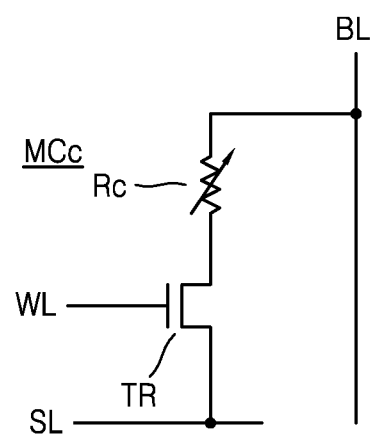

FIGS. 4A to 4C are circuit diagrams illustrating modified examples of the memory cell MC of FIG. 3.

Referring to FIG. 4A, a memory cell MCa may include a variable resistor Ra. The variable resistor Ra may be connected between a bit line BL and a word line WL. The memory cell MCa may store data by the voltages applied to each of the bit line BL and the word line WL.

Referring to FIG. 4B, a memory cell MCb may include a variable resistor Rb and a bidirectional diode Db. The variable resistor Rb may include a resistive material for storing data. The bidirectional diode Db may be connected between the variable resistor Rb and the word line WL, and the variable resistor Rb may be connected between the bit line BL and the bidirectional diode Db. The positions of the bidirectional diode Db and the variable resistor Rb may be switched with each other. The bidirectional diode Db may block a leakage current flowing through a non-selective resistance cell.

Referring to FIG. 4C, a memory cell MCc may include a variable resistor Rc and a transistor TR. The transistor TR may be a selective device, that is, a switching device, that permits or blocks supply of current to the variable resistor Rc according to the voltage of the word line WL. In the exemplary embodiment of FIG. 4C, in addition to the word line WL, a source line SL to adjust voltage levels at the opposite ends of the variable resistor Rc may be further provided. The transistor TR may be connected between the variable resistor Rc and the source line SL, and the variable resistor R may be connected between the bit line BL and the transistor TR. The positions of the transistor TR and the variable resistor Rc may be switched with each other. The memory cell MCc may be selected or may not be selected according to turning on or off of the transistor TR that is driven by the word line WL.

Figure 5:
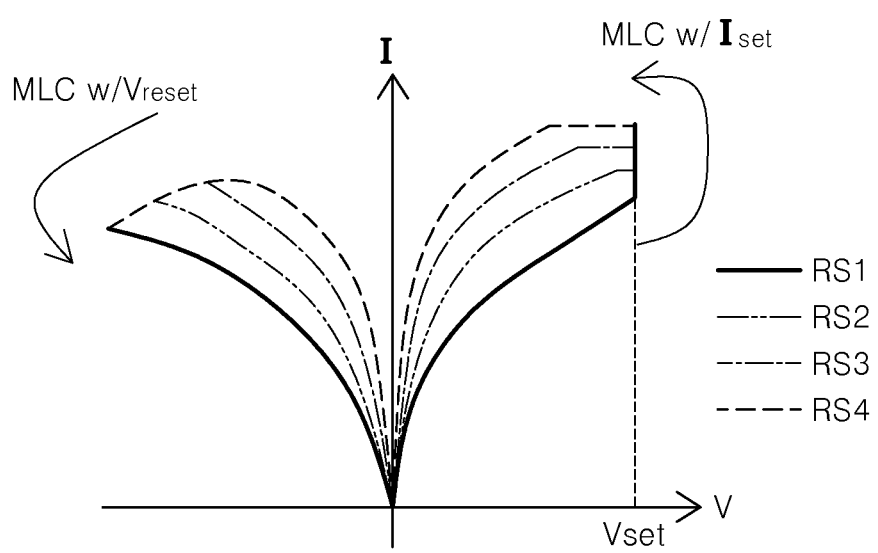
FIG. 5 is a graph showing voltage-current characteristics curves of the memory cell.

FIG. 5 is a graph showing voltage-current characteristics curves of the memory cell MC.

Referring to FIG. 5, a horizontal axis denotes a voltage V and a vertical axis denotes a current I. When the memory cell MC is a multilevel cell MLC, the memory cell MC may have one of a plurality of resistance states according to stored data. For example, as illustrated in FIG. 5, the memory cell MC may have one of first to fourth resistance states RS1, RS2, RS3, and RS4. When the memory cell is in the first resistance state RS1, a resistance value may be defined to be in the largest state. When the memory cell is in the fourth resistance state RS4, the resistance value may be defined to be in the smallest state.

As illustrated in the right side of the graph of FIG. 5, a resistance value of a memory cell may be decreased through a set write operation. In contrast, as illustrated in the left side of the graph, the resistance value of a memory cell may be increased through a reset write operation. During the set write operation, the set voltage Vset may be applied to the memory cell MC and a resistance value of the memory cell MC may vary by adjusting a level of the set current Iset flowing through the memory cell MC. Also, during the reset write operation, a resistance value may vary by adjusting a level of the reset voltage Vreset applied to the memory cell MC. Also, since consumption of current in the reset write operation is relatively small compared to the set write operation, a relatively large number of memory cells may be simultaneously reset written compared to the set write operation.

The erase operation according to the present exemplary embodiment may be performed by changing a resistance state of a memory cell to any one of the resistance states, for example, by changing the resistance state of a memory cell to the first resistance state RS1 having the largest resistance value.

Figure 6A:
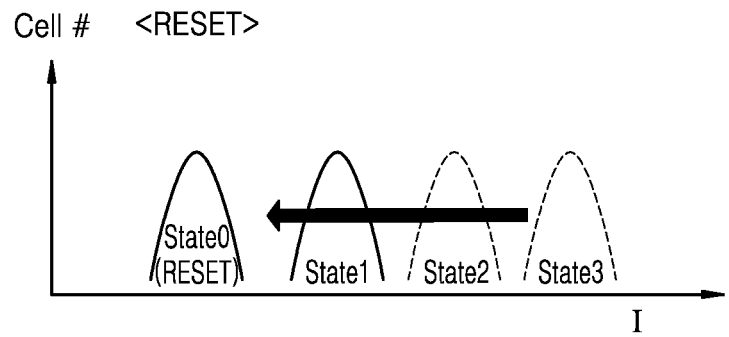
FIGS. 6A and 6B are graphs showing the concepts of an erase operation and a verify operation according to an exemplary embodiment.
Figure 6B:
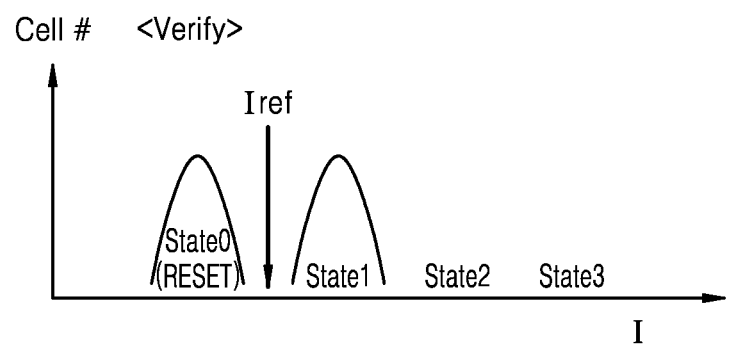

FIGS. 6A and 6B are graphs showing the concepts of the erase operation and the verify operation according to an exemplary embodiment. As illustrated in FIG. 6A, a plurality of memory cells have any one of a plurality of resistance states State0~State3 according to the written data. For example, the memory cells included in any one region may have various resistance states and, as an erase operation is performed on the region, all of the memory cells included in the region n may have an erase state or a reset state State0.

Alternatively, as illustrated in FIG. 6B, in verifying the erase operation, the reference current Iref to classify the resistance state into the reset state State0 and the first state State1 may be used. For example, when a memory cell is read out through a predetermined read voltage Vread, a relatively small read current flows through the memory cells in an erase state, that is, a state having a relatively large resistance value and thus a verification result may be produced by comparing the levels of the read current and the reference current Iref. When the verification result corresponds to fail, the erase operation may be controlled to be performed again on the unit including at least the corresponding memory cells.

Figure 7:
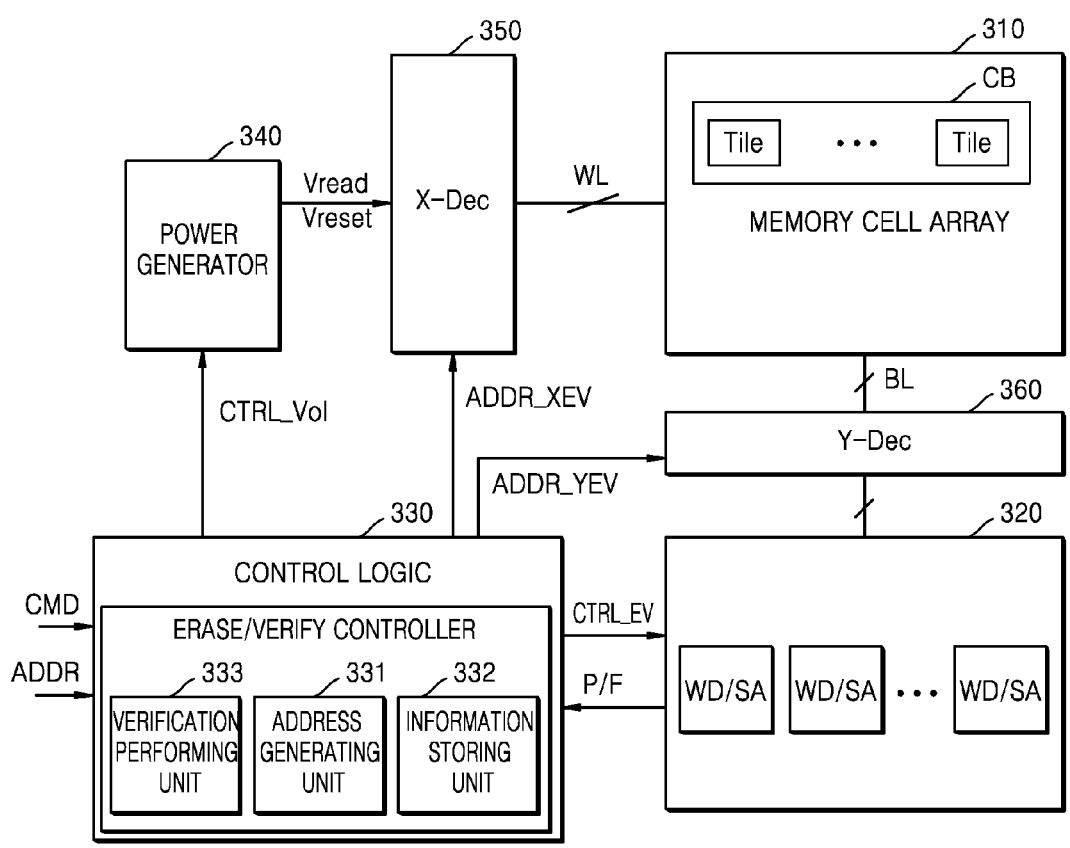
FIG. 7 is a block diagram of a memory device performing erase and verify operations according to another exemplary embodiment.

FIG. 7 is a block diagram of a memory device 300 performing erase and verify operations according to another exemplary embodiment. As illustrated in FIG. 7, the memory device 300 may include a memory cell array 310, a read/write circuit 320, and a control logic 330. Also, the memory device 300 may further include a power generator 340, a row decoder 350, and a column decoder 360. Also, the read/write circuit 320 may include a plurality of write drivers WD and a plurality of sense amplifiers SA. Also, the control logic 330 may include an erase/verify controller for the erase and verify operations of the memory device 300. The erase/verify controller may include an address generating unit 331, an information storing unit 332, and a verification performing unit 333. As described above, at least a part of function blocks of the erase/verify controller may be embodied outside the control logic 330. Alternatively, the memory cells included in the memory cell array 310 may be divided into various regions. For example, the memory cell array 310 may include one or more cell blocks CB and each cell block CB may include a plurality of tiles Tile.

The control logic 330 controls the memory device 300 to perform a read, a write, or an erase operation according to an external command CMD. When an erase operation is performed according the present exemplary embodiment, the erase/verify controller may control the memory device 300 to select at least two memory cells and erase the selected memory cells at the same time. Also, the erase/verify controller may control the memory device 300 to select at least two memory cells and verify the selected memory cells at the same time. According to a control signal CTRL_vol of the control logic 330, during the erase operation, the reset voltage Vreset is provided to the memory cell array 310, and during the verify operation, the read voltage Vread may be provided to the memory cell array 310. Also, during the erase and verify operations, a row address ADDR_XEV and a column address ADDR_YEV for simultaneously selecting two or more memory cells may be provided to a row decoder 350 and a column decoder 360, respectively. Also, during the erase and verify operations, a control signal CTRL_EV for controlling a write driver and a sense amplifier may be provided to the read/write circuit 320 and, during the verify operation, the read/write circuit 320 may provide a pass/fail signal P/F to the control logic 330 as a verify result.

The address generating unit 331 may generate addresses ADDR_XEV and ADDR_YEV for selecting a memory cell during the erase and verify operations. The memory cell selecting operation may be variously modified according to a connection relation between the bit lines BL and the write driver WD/sense amplifier SA. Also, the positions of the memory cells to be selected at the same time may be set in various ways. Also, the number of memory cells that are simultaneously selected may be changed according to an allowable maximum current supported by the memory device 300. The information storing unit 332 may include information indicating the positions of the memory cells to be selected at the same time described above. The address generating unit 331 may generate the addresses ADDR_XEV and ADDR_YEV by referring to the information of the information storing unit 332. Alternatively, the verification performing unit 333 may receive and analyze the pass/fail signal P/F and generate a verify result. The control logic 330 may control the operation of the memory device 300 based on the verification result.

Alternatively, although in the exemplary embodiment of FIG. 7, the addresses ADDR_XEV and ADDR_YEV for simultaneously selecting two or more memory cells in the erase and verify operations are generated inside the memory device 300, the present exemplary embodiment is not limited thereto. For example, as described above, the selection of the memory cells in the erase and verify operations may be performed by using the address ADDR from the memory controller. The control logic 330 may extract the row address ADDR_XEV and the column address ADDR_YEV from the address ADDR from the memory controller without a separate address generation operation, and provide the extracted row address ADDR_XEV and column address ADDR_YEV. Various pieces of information to be referred to in order to simultaneously select memory cells may be stored in the memory controller.

Figure 8A:
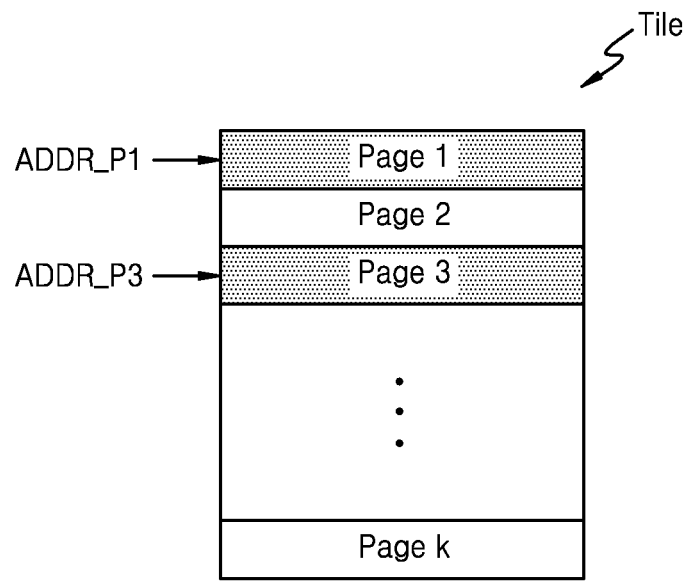
FIGS. 8A, 8B, and 8C are block diagrams showing various examples of the erase operation.
Figure 8B:
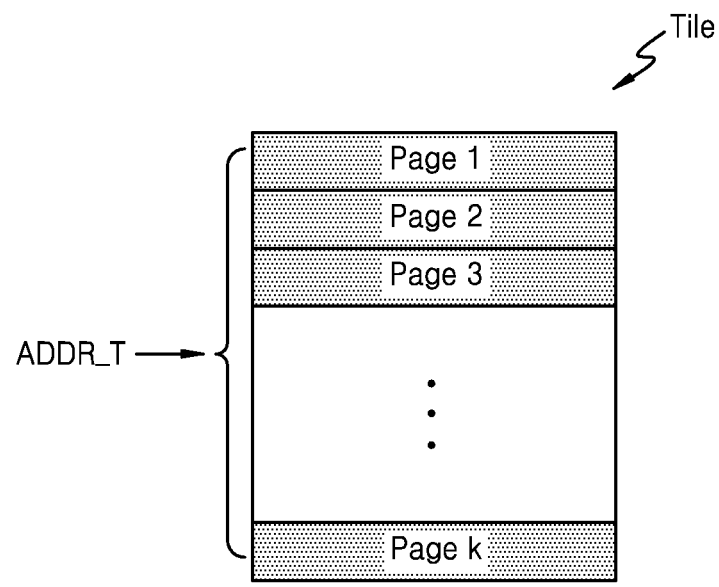
Figure 8C:
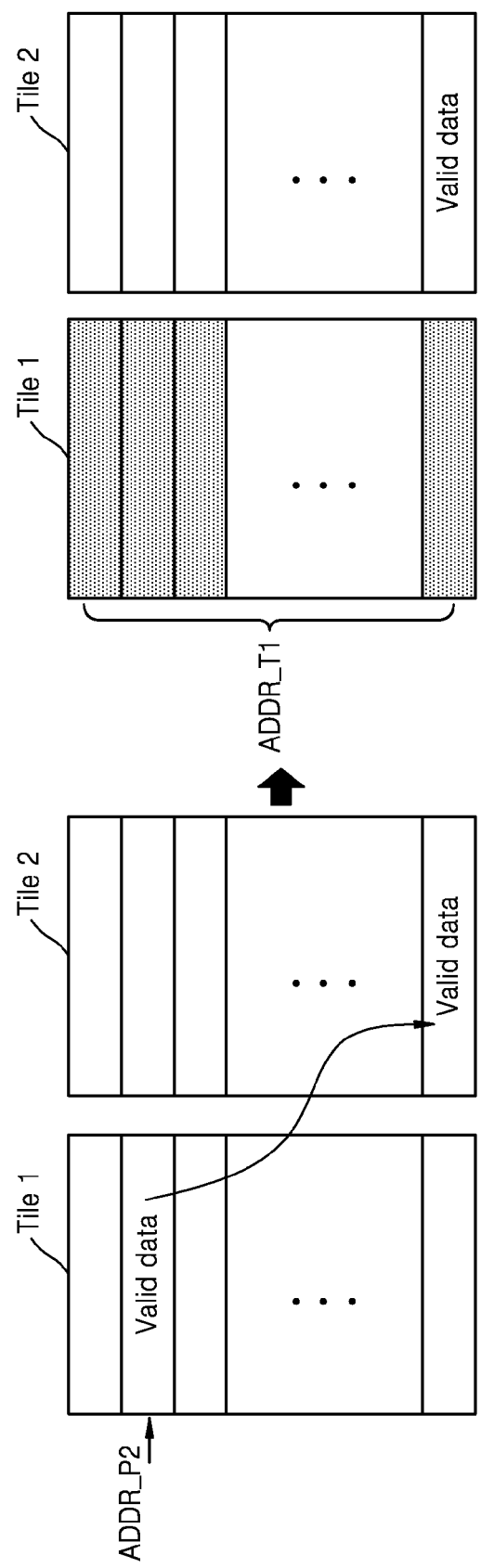

FIGS. 8A, 8B, and 8C are block diagrams showing various examples of the erase operation. As illustrated in FIG. 8A, the erase operation may be performed in units of pages, and addresses ADDR_P1 and ADDR_P3 indicating erasing of first and third pages of any one tile Tile may be provided to the memory device. The memory device may erase memory cells included in the first and third pages in response to the addresses ADDR_P1 and ADDR_P3 and may simultaneously select and erase at least two memory cells.

Alternatively, as illustrated in FIG. 8B, the erase operation may be performed in units of tiles, an address ADDR_T indicating a tile to be erased may be provided to the memory device. The memory device may erase the memory cells included in the tile in response to the address ADDR_T. As described above, at least two memory cells may be simultaneously erased.

Alternatively, FIG. 8C illustrates an operation of securing a tile in an erase state. Under the control of the memory controller, one or more tiles in the memory device may be erased. If a first tile Tile1 corresponds to the tile to be erased and includes valid data, for example, data of a second page, in response to an address ADDR_P2 indicating the page storing the valid data, the valid data is moved to another tile, for example, a second tile Tile2, and then the memory cells included in the first tile Tile1 may be erased according to an address ADDR_T1 indicating the first tile Tile1 to be erased.

In the following description, various examples of selecting a memory cell during the erase and verify operations according exemplary embodiments are described. Also, it is assumed that a memory cell is erased by performing a reset write operation.

Figure 9:
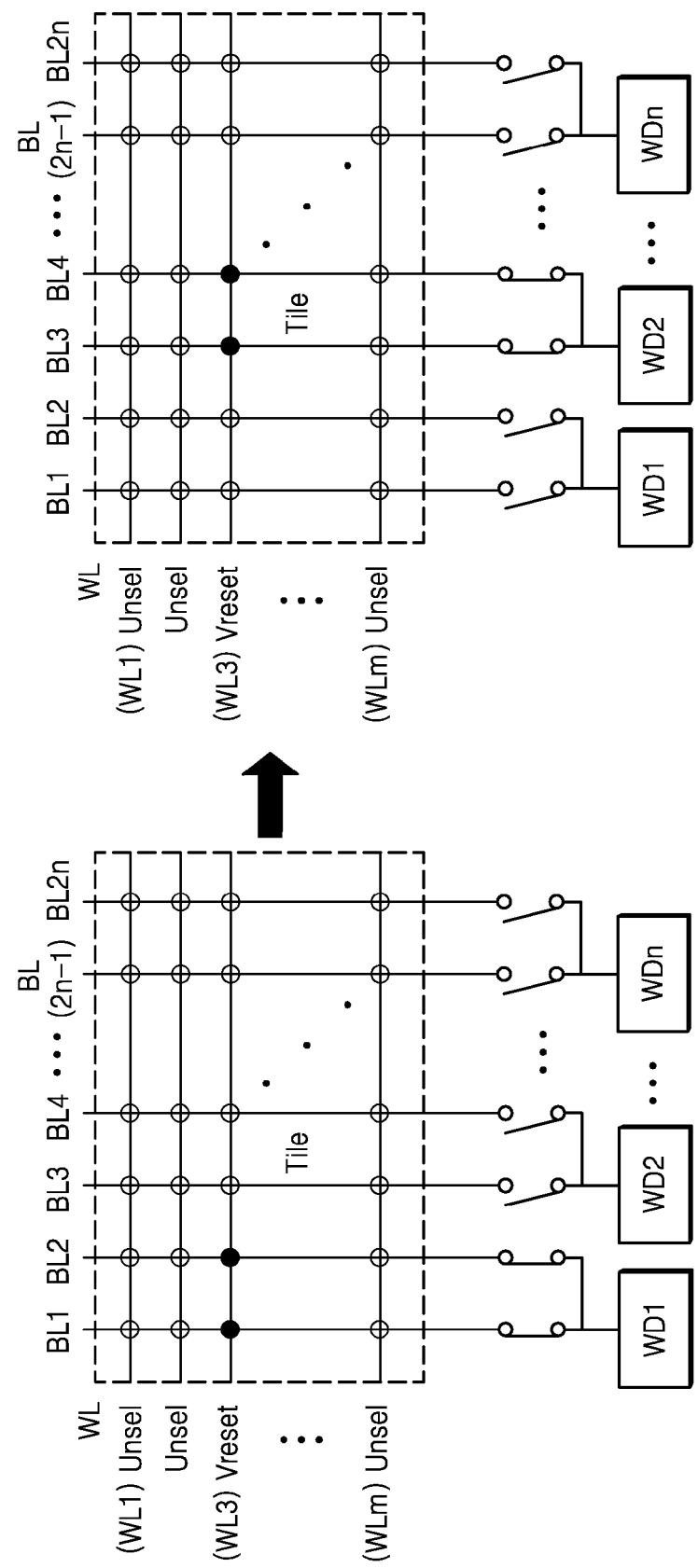
FIG. 9 is a circuit diagram illustrating an example of selecting a memory cell during an erase operation.

FIG. 9 is a circuit diagram illustrating an example of selecting a memory cell during an erase operation. In FIG. 9, for example, memory cells in one tile Tile are selected. In another exemplary embodiment, the memory cells included in two or more tiles are simultaneously selected and then a verify operation may be performed. Alternatively, when a verify operation is performed by a reset write operation, a reset write voltage Vreset may be provided to a selected word line. The reset write voltage Vreset may be a voltage signal having a relatively large level or a signal having a ground voltage level.

As illustrated in FIG. 9, one tile may include a plurality of memory cells arranged in the regions where a plurality of word lines and a plurality of bit lines intersect. Also, a plurality of write drivers may be arranged to drive the bit lines. For example, FIG. 9 illustrates an example in which one write driver is arranged corresponding to two bit lines. A switch to select a bit line may be arranged between the memory cell and the write driver. In an example, the switch to select the bit line may be a switch included in the column decoder 160 of FIG. 2. Assuming that the number of bit lines is 2n, first to n-th write drivers WD1~WDn may be arranged corresponding to one tile. It is assumed that the number of the word lines WL1~WLm is m.

According to the exemplary embodiment of FIG. 9, when the memory cells are selected during the erase operation, two or more memory cells connected to one word line may be simultaneously selected. If the erase operation is performed on all memory cells of the tile Tile, the first word line to the m-th word line WL1~WLm may be sequentially selected. If any one word line is selected, a plurality of bit lines may be selected.

For example, as the third word line WL3 is selected and the first write driver WD1 is activated, the reset write operation may be performed on the memory cells connected to the first and second bit lines BL1 and BL2. Then, as the second write driver WD2 is activated, the reset write operation is performed on the memory cells connected to the third and fourth bit lines BL3 and BL4. As the above write operation is repeated, the reset write operation may be performed on all memory cells connected to the third word line WL3. After the reset write operation is performed with respect to the third word line WL3, another word line is selected and the reset write operation may be performed on the memory cells of a selected word line.

Although FIG. 9 illustrates an example in which one write driver is activated and the reset write operation is simultaneously performed on two memory cells, the present exemplary embodiment is not limited thereto. For example, as two or more write drivers are simultaneously activated, the reset write operation may be simultaneously performed on more memory cells. When the resistive memory device according to the present exemplary embodiment is applied to RRAM, the reset write operation may consume a relatively small amount of current compared to the set write operation. The number of memory cells on which the reset write operation is simultaneously performed may be adjusted considering the maximum current value supported by the resistive memory device.

Figure 10:
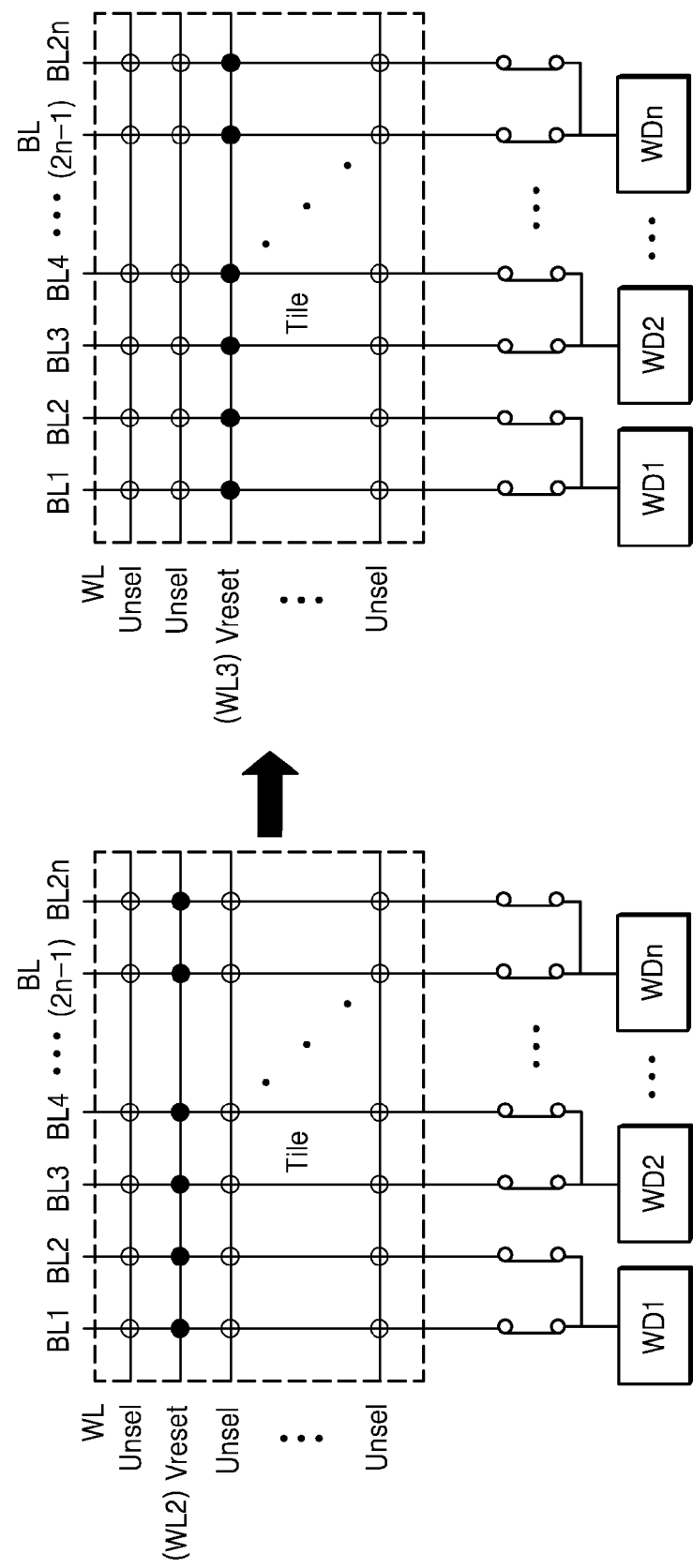
FIG. 10 is a circuit diagram illustrating another example of selecting a memory cell during an erase operation.

FIG. 10 is a circuit diagram illustrating another example of selecting a memory cell during an erase operation. In FIG. 10, for example, all bit lines included in one tile Tile are simultaneously selected.

During the erase operation, in selecting the memory cells, as one word line and all bit lines are selected, a plurality of memory cells may be simultaneously selected. If the erase operation is performed on all memory cells of the tile Tile, all word lines included in the tile Tile are sequentially selected and thus all memory cells of the tile Tile may be erased.

According to an exemplary embodiment, FIG. 10 illustrates an example in which the second word line WL2 is selected and all memory cells connected to the second word line WL2 and then the third word line WL3 is selected. When 2n-number of the bit lines BL1~BL2n are included in the tile Tile, and n-number of the write drivers WD1~WDn are arranged corresponding thereto, as one word line is selected, the n-number of the write drivers WD1~WDn may be all activated.

When the second word line WL2 is selected and the n-number of the write drivers WD1~WDn are all activated, the first write driver WD1 may perform the reset write operation on two memory cells arranged in regions where the second word line WL2 and the first and second bit lines BL1 and BL2 intersect. Simultaneously, the second write driver WD2 may perform the reset write operation on two memory cells arranged in regions where the second word line WL2 and the third and fourth bit lines BL3 and BL4 intersect. In the same manner, the n-th write driver WDn may perform the reset write operation on two memory cells arranged in regions where the second word line WL2 and the (2n−1)th and second bit lines BL(2n−1) and BL2n intersect.

Although FIGS. 9 and 10 illustrate examples in which one write driver simultaneously performs a reset write operation on a plurality of memory cells connected to two bit lines neighboring each other, the present exemplary embodiment is not limited thereto. For example, one write driver may be commonly connected to a plurality of bit lines that do not neighbor each other. Accordingly, the write driver may simultaneously perform a reset write operation on a plurality of memory cells that do not neighbor each other.

Figure 11:
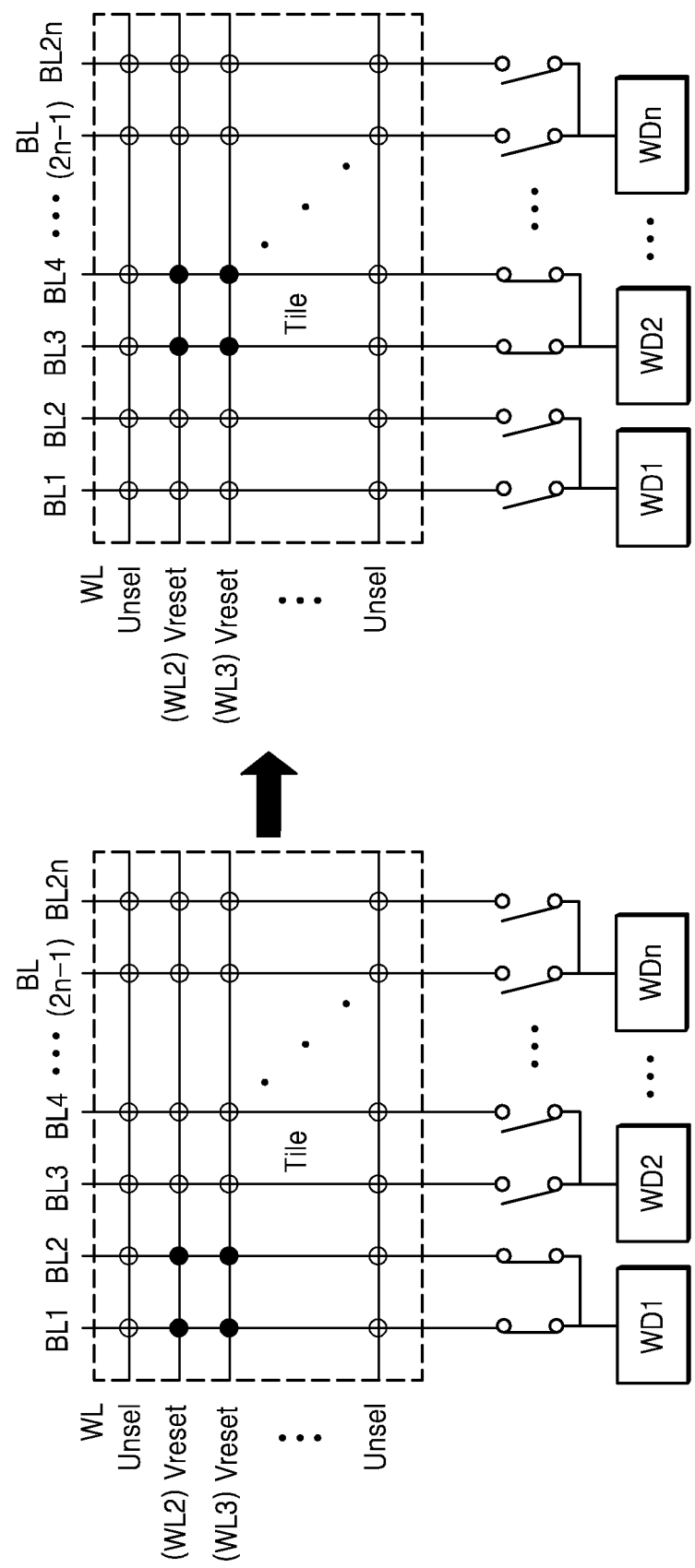
FIG. 11 is a circuit diagram illustrating another example of selecting a memory cell during an erase operation.

FIG. 11 is a circuit diagram illustrating another example of selecting a memory cell during an erase operation. In FIG. 11, for example, at least two word lines and at least two bit lines are selected and a reset write operation is simultaneously performed on at least two memory cells.

As illustrates in FIG. 11, two or more word lines, for example, the second and third word lines WL2 and WL3, are simultaneously selected. At the same time, two or more bit lines may be simultaneously selected. For example, when each of the n-number of write drivers WD1~WDn is connected to two bit lines, one or more write drivers may be activated. When the first write driver WD1 is activated and two bit lines BL1 and BL2 connected to the first write driver WD1 are selected, a reset write operation may be simultaneously performed on the memory cells connected to the word lines WL2 and WL3 and the bit lines BL1 and BL2. Then, while the selection of the second and third word lines WL2 and WL3 is maintained, another write driver, for example, the second write driver WD2, is activated and thus the reset write operation may be performed on the memory cells connected to the other bit lines BL3 and BL4. In the same manner, after the reset write operation on the memory cells of the second and third word lines WL2 and WL3 are all completed, another two or more word lines may be selected.

According to the exemplary embodiment of FIG. 11, one write driver may simultaneously perform the reset write operation on the memory cells connected to different word lines and different bit lines. Also, although FIG. 11 illustrates an example in which only one write driver is activated during the simultaneous reset write operation, a plurality of write drivers may be simultaneously activated within a current value allowed by the memory device and thus the reset write operation may be simultaneously performed on a greater number of memory cells.

Figure 12:
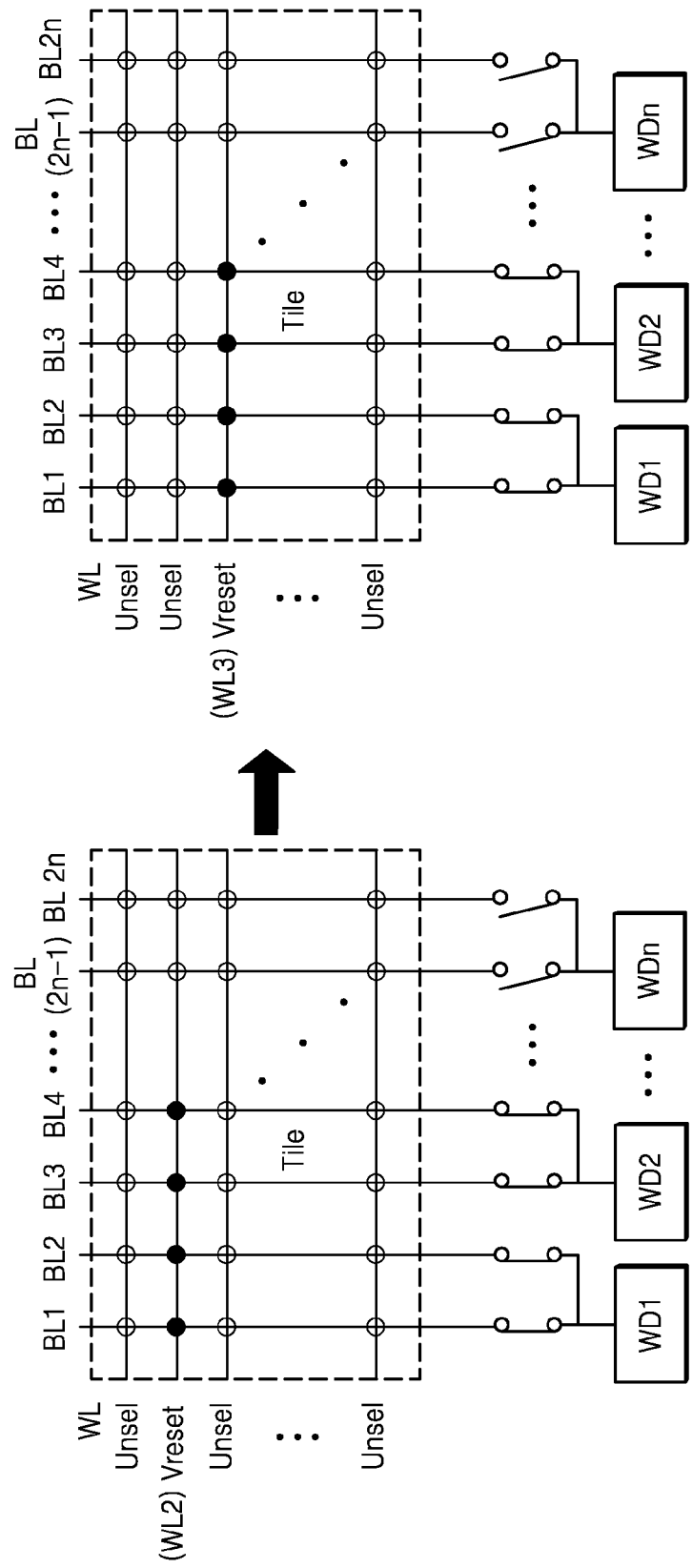
FIG. 12 is a circuit diagram illustrating another example of selecting a memory cell during an erase operation.

FIG. 12 is a circuit diagram illustrating another example of selecting a memory cell during an erase operation. In FIG. 12, for example, some of memory cells connected to a particular word line are reset-written and then memory cells connected to another word line are reset-written. Also, although not illustrated in FIG. 12, after a reset write operation is performed on the other word line, the reset write operation may be performed on the other memory cells connected to the particular word line.

As illustrated in FIG. 12, as the erase operation is performed on the tile Tile, the first to m-th word lines WL1~WLm are sequentially selected. When any one word line is selected, some of the 2n-number of bit lines BL1~BL2n may be selected. For example, as the second word line WL2 is selected, some of the n-number of write drivers WD1~WDn, for example, the first and second write drivers, are activated, and the other write drivers, for example, the n-th write driver, are inactivated, some of the memory cells connected to the second word line WL2 may be reset-written. Then, as the third word line WL3 is selected, the memory cells connected to the third word line WL3 may be reset-written. Thereafter, the second word line WL2 is selected again and the other memory cells may be reset-written.

Each of the erase operations illustrated in FIGS. 9 to 12 is a mere exemplary embodiment and thus the present exemplary embodiment may be variously modified. For example, in some exemplary embodiment, one write driver may be embodied to simultaneously perform the reset write operation on at least two memory cells located at various positions in one tile. Accordingly, one write driver may be embodied to be able to simultaneously perform the reset write operation on two or more memory cells that do not neighbor each other in one tile. Also, the order of selecting the word lines and/or bit lines may be sequentially or randomly set.

Figure 13A:
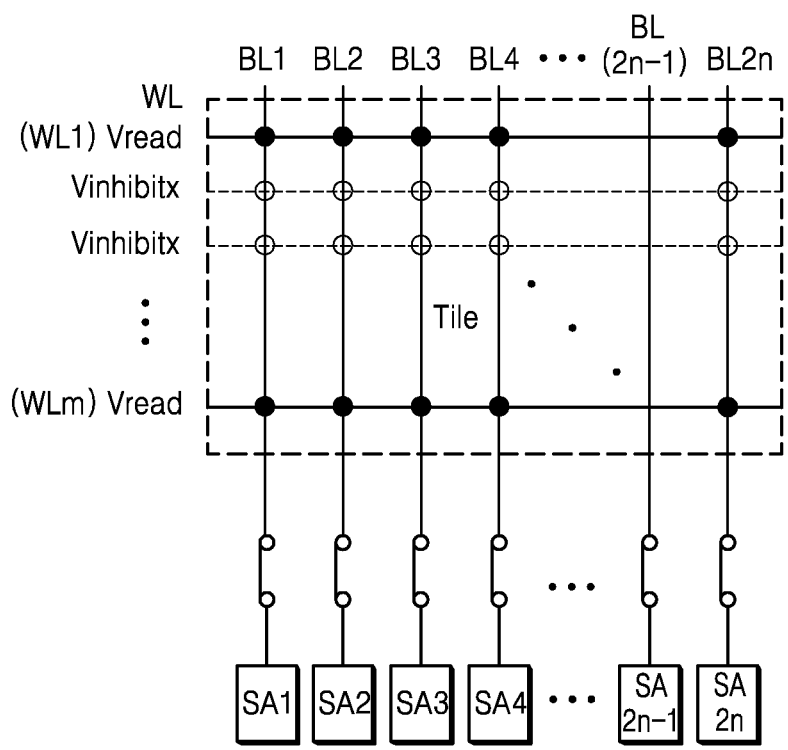
FIGS. 13A, 13B, and 13C are circuit diagrams illustrating an example of selecting a memory cell during a verify operation.
Figure 13B:
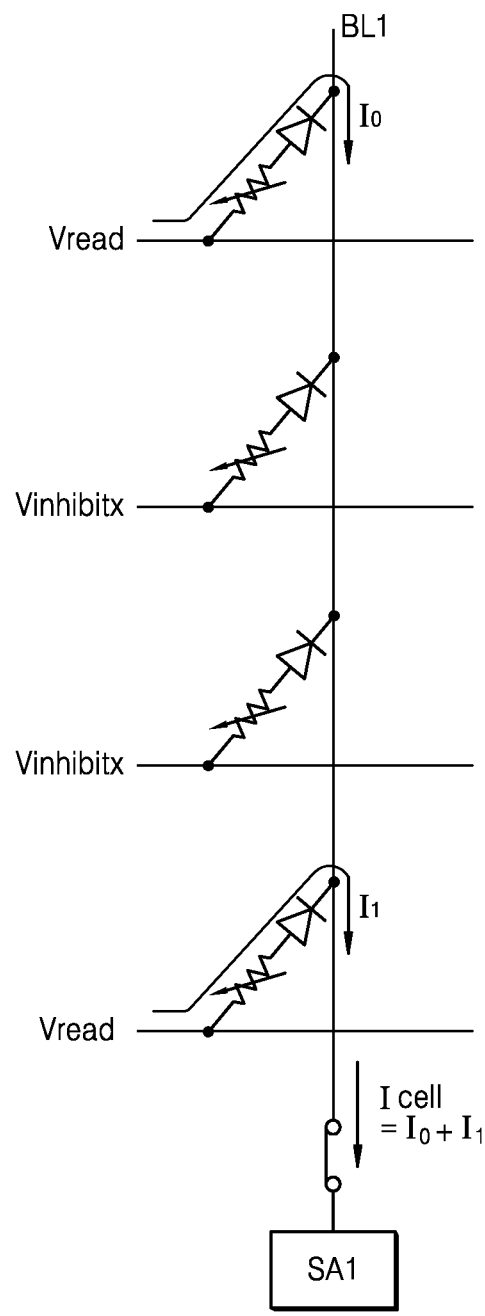
Figure 13C:
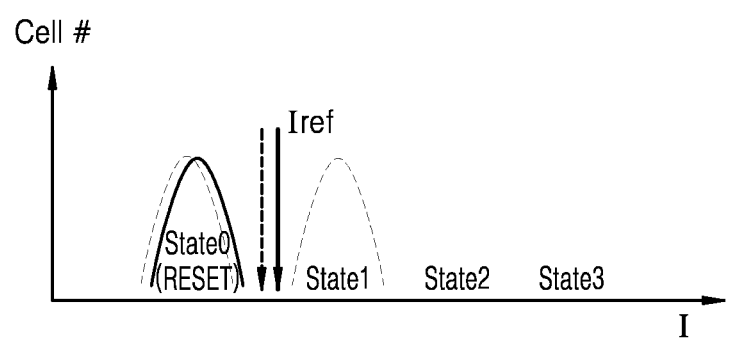

FIGS. 13A, 13B, and 13C are circuit diagrams illustrating an example of selecting a memory cell during a verify operation. In FIGS. 13A, 13B, and 13C, for example, memory cells are selected in one tile Tile. The verify operation may be performed through a verify read operation with respect to erased memory cells. For example, a pass/fail signal that indicates the existence of a memory cell, on which a reset write operation is not normally performed, through the verify read operation, may be generated as a result of the verification.

Alternatively, a verify operation according to the present exemplary embodiment may be performed in various ways. For example, after a reset write operation and a verify operation thereto are performed on at least two memory cells, a reset write operation and a verify operation may be performed on other memory cells. Alternatively, after all memory cells for each of predetermined regions are reset-written, a verify operation may be performed in units of the regions.

As illustrated in FIG. 13A, the tile Tile may include a plurality of memory cells arranged in regions where a plurality of word lines and a plurality of bit lines intersect. Also, a plurality of sense amplifiers may be arranged corresponding to a plurality of bit lines. For example, in FIG. 13A, one sense amplifier is arranged corresponding to one bit line.

In performing the verify operation, at least two memory cells are simultaneously selected and one sense amplifier receives a read result from the at least two memory cells, a verify result according to a received read result may be generated. According to an exemplary embodiment, a plurality of word lines may be simultaneously selected. Also, as illustrated in FIG. 13A, two word lines, for example, the first and m-th word lines WL1 and WLm may be simultaneously selected. The read voltage Vread may be applied to the selected word lines WL1 and WLm, and an inhibition voltage Vinhibitx may be applied to the other word lines.

Each of sense amplifiers SA1~SA2n may receive a read result from at least two memory cells through the bit lines corresponding thereto. For example, the first sense amplifier SA1 may receive a read result from the memory cells connected to the selected word lines WL1 and WLm through the first bit line BL1, and may generate a verify result by sensing and amplifying a received read result. Similarly to the above, a sense amplifier connected to another bit line may also receive a read result from at least two memory cells through corresponding bit lines, and may generate a verify result by sensing and amplifying a received read result.

Although FIG. 13A illustrates an example in which two word lines are simultaneously selected in selecting the memory cells for the verify read operation, the present exemplary embodiment is not limited thereto. For example, three or more word lines are simultaneously selected and thus a read result from the three or more memory cells may be provided to the sense amplifier. Similarly to the above, although FIG. 13A illustrates an example in which all sense amplifiers SA1~SA2n are simultaneously activated, only some of the sense amplifiers may be simultaneously activated. In other words, the number of memory cells on which the verify read operation is simultaneously performed may be adjusted considering a current value supported by the resistive memory device.

FIG. 13B is a circuit diagram illustrating an example of a read result that is provided to the sense amplifier, for example, the first sense amplifier SA1. Each of the selected memory cells may generate a read current as a read result. In each memory cell, the read current may be a current flowing from the word line to the bit line via a resistor and a diode. Reversely, the read current may flow from the bit line to the word line via a resistor and a diode.

Also, the selected memory cells have a structure of being connected in parallel with respect to the first bit line BL1. Accordingly, read currents I0 and I1 from the selected memory cells may be provided to the first sense amplifier SA1 by being added to each other through the first bit line BL1. When the current provided to the first sense amplifier SA1 is defined to be a cell current Icell, the cell current Icell may have a value of I0+I1.

As illustrated in FIG. 13B, whether to pass or fail may be determined according to the value of the cell current Icell provided to the first sense amplifier SA1. For example, the memory cells on which the reset write operation is normally performed may have a relatively large resistance value. Accordingly, a read current value may have a relatively small value. The cell current Icell that is obtained by summing the read currents from at least two memory cells may be compared with a predetermined critical value, for example, a reference current. If a value of the cell current Icell is less than the predetermined critical value, the selected memory cells may be determined to be ones on which the erase operation is normally performed. In contrast, if the value of cell current Icell is equal to or greater than the critical value, at least one of the memory cells may be determined to not be normally erased.

FIG. 13C illustrates an example in which a level of the reference current Iref to determine pass or fail varies when a plurality of memory cells are simultaneously verified. Since the value of the cell current Icell obtained by summing the read currents from at least two memory cells is used for determining pass or fail, a level of the reference current Iref to be compared with the value of the cell current Icell varies. For example, the level of the reference current Iref may increase. An amount of variation in the level of the reference current Iref may be variously set. For example, as the number of memory cells that are simultaneously verified by one sense amplifier increases, the level of the reference current Iref may further increase.

Figure 14A:
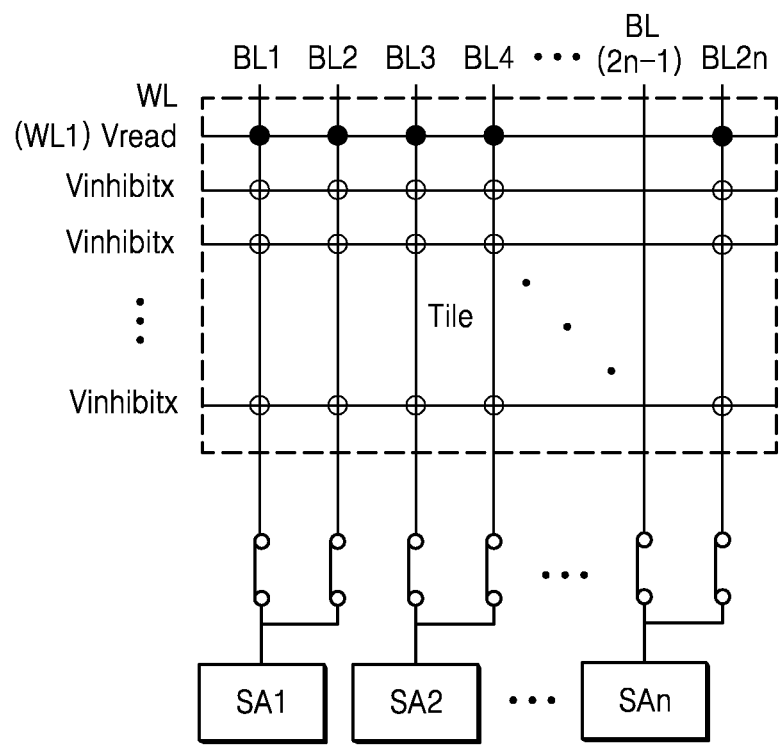
FIGS. 14A and 14B are circuit diagrams illustrating another example of selecting a memory cell during a verify operation.
Figure 14B:
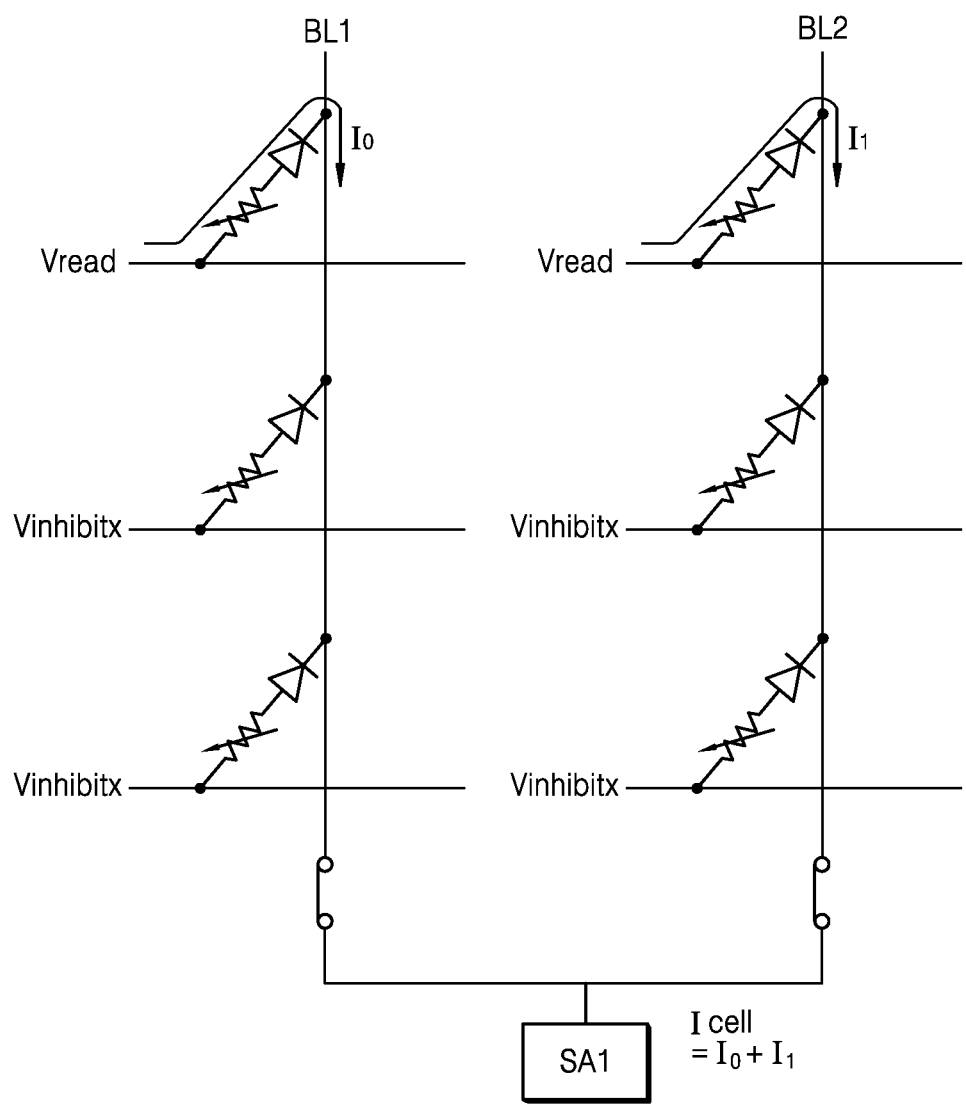

FIGS. 14A and 14B are circuit diagrams illustrating another example of selecting a memory cell during a verify operation. In FIG. 14A, for example, each sense amplifier is connected to at least two bit lines and receives a read result from at least two memory cells. Also, 2n-number of bit lines BL1~BL2n are arranged in one tile Tile and n-number of sense amplifiers SA1~SAn are arranged corresponding thereto.

In selecting at least two memory cells for the verify operation, one word line, for example, the first word line WL1 may be selected and two or more bit lines BL1~BL2n may be selected. Referring to the first sense amplifier SA1, as the first and second bit lines BL1 and BL2 connected to the first sense amplifier SA1 are selected, two memory cells arranged in regions where the first word line WL1 and the first and second bit lines BL1 and BL2 intersect may be selected. The read result from the selected memory cells may be provided to the first sense amplifier SA1. The first sense amplifier SA1 may generate a verify result by sensing and amplifying the read result. As described above, after the verify operation is performed on the first word line WL1, another word line is selected and the verify operation may be repeatedly performed.

Alternatively, in FIG. 14A, during the verify operation, all bit lines BL1~BL2n are simultaneously selected and all sense amplifiers SA1~SAn are simultaneously activated. However, the present exemplary embodiment is not limited thereto. For example, as only some sense amplifiers and the bit lines connected thereto are selected, the verify operation may be simultaneously performed on some of the memory cells connected to one word line. As described above, the number of memory cells on which the verify read operation is simultaneously performed may be adjusted considering a current value supported by the resistive memory device.

FIG. 14B is a circuit diagram illustrating an example in which a read result is provided to the sense amplifier of FIG. 14A, for example, the first sense amplifier SA1. The first read result I0 may be provided to the first sense amplifier SA1 through the first bit line BL1 and the second read result I1 may be provided to the first sense amplifier SA1 through the second bit line BL2. In other words, the first and second bit lines BL1 and BL2 may be parallelly connected to each other with respect to the first sense amplifier SA1. Accordingly, the first sense amplifier SA1 receives the cell current Icell that is a sum of the first read result I0 and the second read result I1. The first sense amplifier SA1 may generate a verify result by sensing and amplifying the cell current Icell.

Figure 15A:
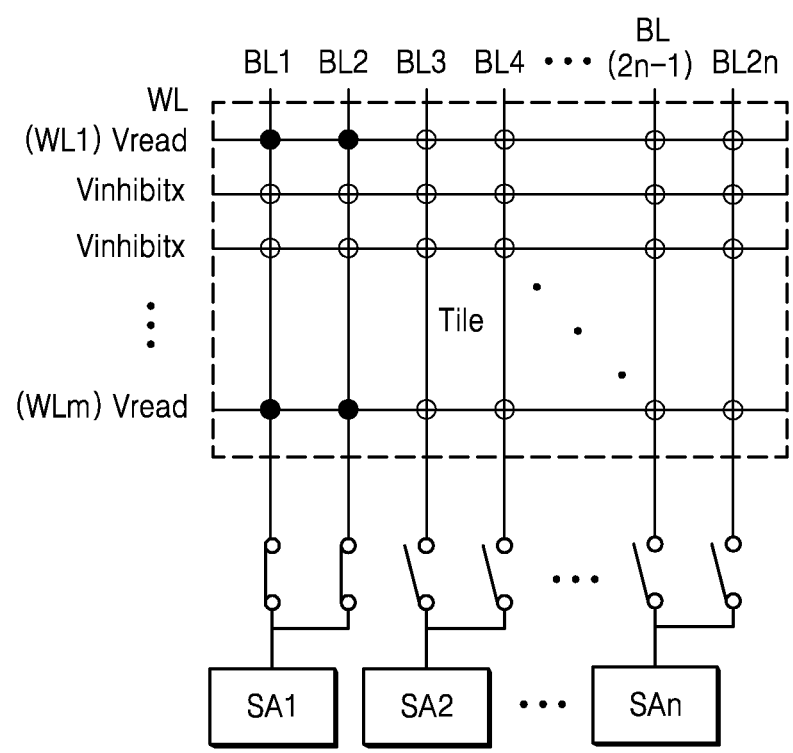
FIGS. 15A and 15B are circuit diagrams illustrating another example of selecting a memory cell during a verify operation.
Figure 15B:
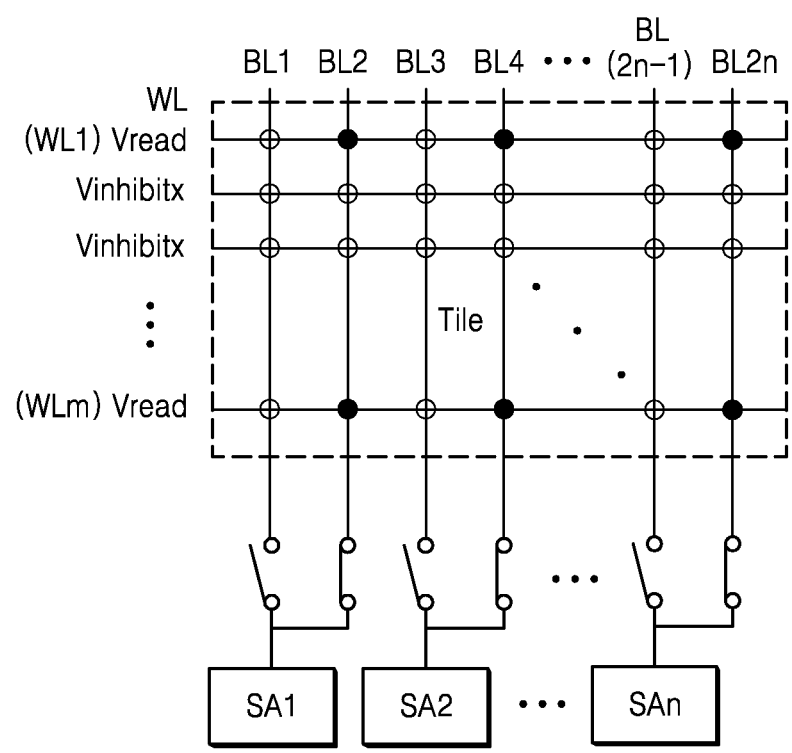

FIGS. 15A and 15B are circuit diagrams illustrating another example of selecting a memory cell during a verify operation. In FIGS. 15A and 15B, for example, during the verify read operation, two or more word lines and two or more bit lines are simultaneously selected. Also, the 2n-number of bit lines BL1~BL2n and the n-number of sense amplifiers SA1~San corresponding thereto are arranged in one the tile Tile.

As illustrated in FIG. 15A, in simultaneously selecting a plurality of memory cells, two word lines, for example, the first and m-th word lines WL1 and WLm are simultaneously selected, and two bit lines, for example, the first and second bit lines BL1 and BL2 connected to one sense amplifier may be simultaneously selected. Also, the first sense amplifier SA1 commonly connected to the first and second bit lines BL1 and BL2 may be activated. Accordingly, the read result from the memory cells arranged in regions where the first and m-th word lines WL1 and WLm and the first and second bit lines BL1 and BL2 intersect may be provided to the first sense amplifier SA1. The first sense amplifier SA1 may receive a cell current obtained by summing a plurality of read currents and generate a verify result through the sensing and amplifying operations on the obtained cell current.

Then, the second to n-th sense amplifiers SA2~San are sequentially activated. Accordingly, all memory cells connected to the first and m-th word lines WL1 and WLm may be verified. Thereafter, other two or more word lines are selected and the above-described verify operation may be repeated.

Alternatively, although FIG. 15A illustrates that only one sense amplifier is activated in the verify operation, the present exemplary embodiment is not limited thereto. For example, with two or more sense amplifiers being activated, a plurality of bit lines corresponding thereto may be simultaneously selected. As described above, the number of memory cells on which the verify read operation is simultaneously performed may be adjusted considering the maximum current value supported by the resistive memory device.

Alternatively, as illustrated in FIG. 15B, only any one of the two bit lines connected to one sense amplifier may be selected. Referring to the first sense amplifier SA1, with the selection of the first and m-th word lines WL1 and WLm, the second bit line BL2 connected to the first sense amplifier SA1 is selected. In contrast, the first bit line BL1 connected to the first sense amplifier SA1 is not selected. Accordingly, the first sense amplifier SA1 may receive the read result from the memory cells arranged in regions where the first and m-th word lines WL1 and WLm and the second bit line BL2 intersect. After the verify result is generated, as the other bit lines, for example, the bit lines BL1, BL3, . . . are selected, the verify operation may be performed on the other memory cells.

Figure 16:
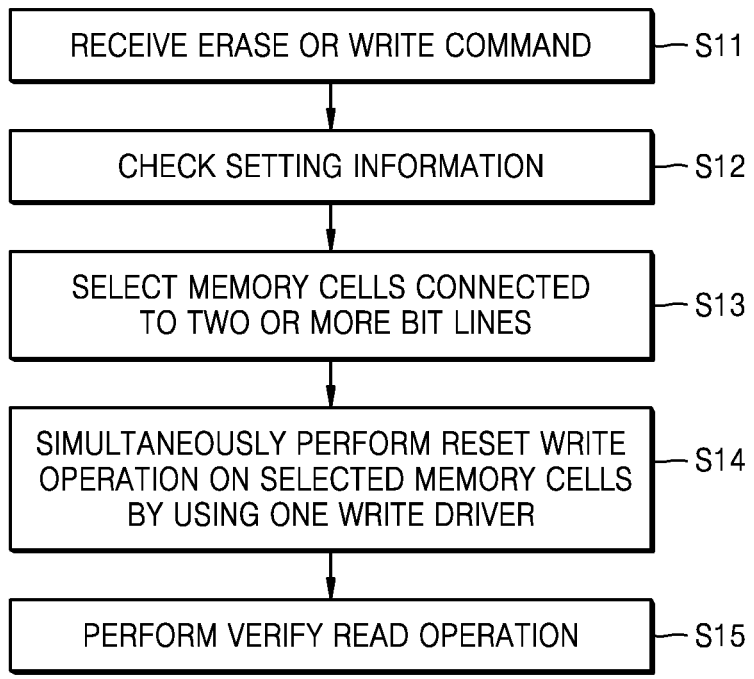
FIG. 16 is a flowchart for describing a method of operating a resistive memory device according to an exemplary embodiment.

FIG. 16 is a flowchart for describing a method of operating a resistive memory device according to an exemplary embodiment.

As illustrated in FIG. 16, to perform the verify operation on the memory device, the memory device receives an erase or write command from the memory controller (S11). The memory controller may determine whether to perform the verify operation according to a request from the host or by self-determination and provide an erase or write command to control the verify operation on the memory device.

A memory operation according to an erase command or a memory operation according to a write command may be variously set. For example, the erase command is a separate command discussed between the memory controller and the memory device. The memory controller may provide the erase command to the memory device and also provide data corresponding to a reset state to the memory device in order to change the memory cells to the reset state. Alternatively, when receiving the erase command, the memory device may internally generate data for the verify operation.

The memory device may check various pieces of setting information for selecting the memory cells to be erased in order to simultaneously erase at least two memory cells (S12). An address to select memory cells may be generated according to a result of checking the setting information. This is an example in which the address to select the memory cell to be erased is generated in the memory device. When the memory cell to be erased is directly selected by the memory controller, the setting information checking operation may be omitted.

An operation of selecting the memory cells connected to two or more bit lines is performed according to the setting information checking (S13). The selected two or more memory cells may be connected to one write driver. Accordingly, the selected memory cells are simultaneously reset-written by using one write driver (S14). A verify read operation is performed to determine whether the reset write operation is normally performed (S15).

Figure 17:
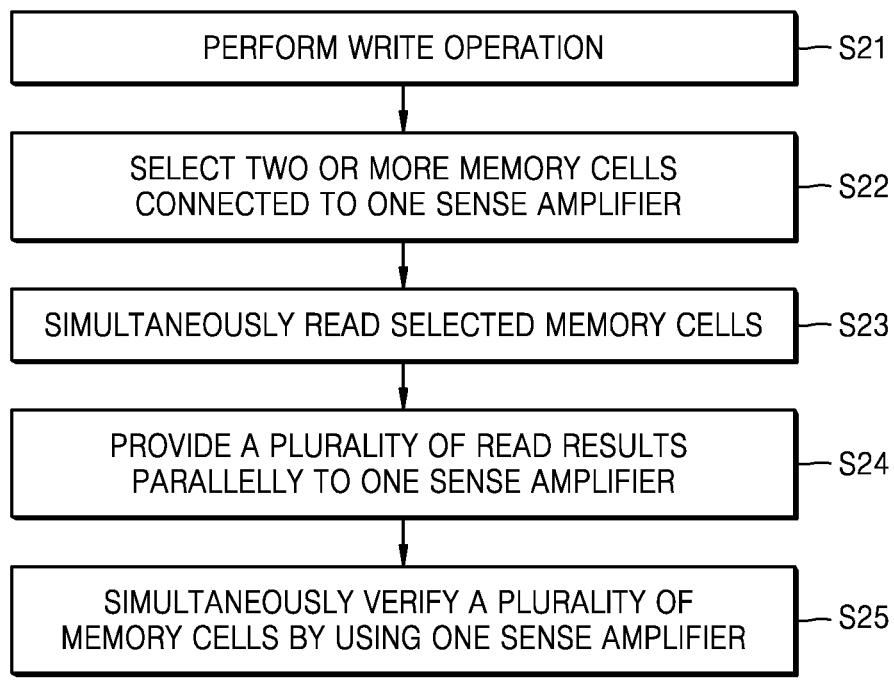
FIG. 17 is a flowchart for describing a method of operating a resistive memory device according to another exemplary embodiment.

FIG. 17 is a flowchart for describing a method of operating a resistive memory device according to another exemplary embodiment.

The verify operation according to the present exemplary embodiment may be performed to determine whether the state of the memory cells is normally changed to the reset state after the erase operation is performed on the memory cells. Also, the verify operation may be performed to determine whether data is normally written after a general write operation is performed on the memory cells. Accordingly, the write operation is performed (S21). The verify operation may be sequentially performed after the write operation.

In performing the verify operation, two or more memory cells are simultaneously selected and verification is performed. For example, two or more memory cells connected to one sense amplifier are selected (S22). Also, the read operation is simultaneously performed on the selected two or more memory cells (S23). A plurality of read results corresponding to a plurality of memory cells are parallelly provided to one sense amplifier (S24). The sense amplifier may receive a result of the sum of a plurality of read results, for example, combined cell currents and the verification on a plurality of memory cells may be simultaneously performed by comparing the combined cell currents with a predetermined reference value (S25).

Figure 18:
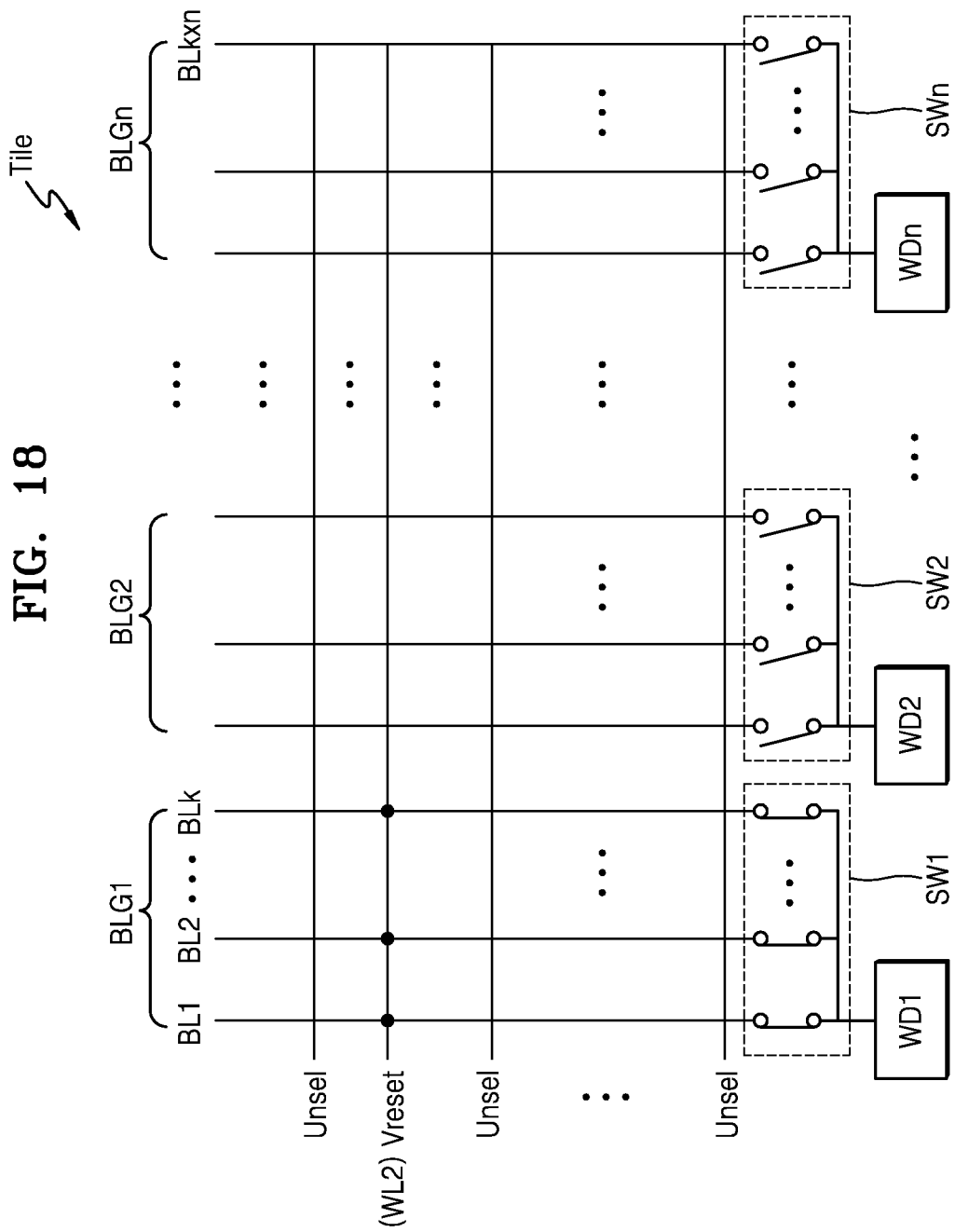
FIGS. 18 and 19 are circuit diagrams illustrating examples of a resistive memory device according to another exemplary embodiment.
Figure 19:
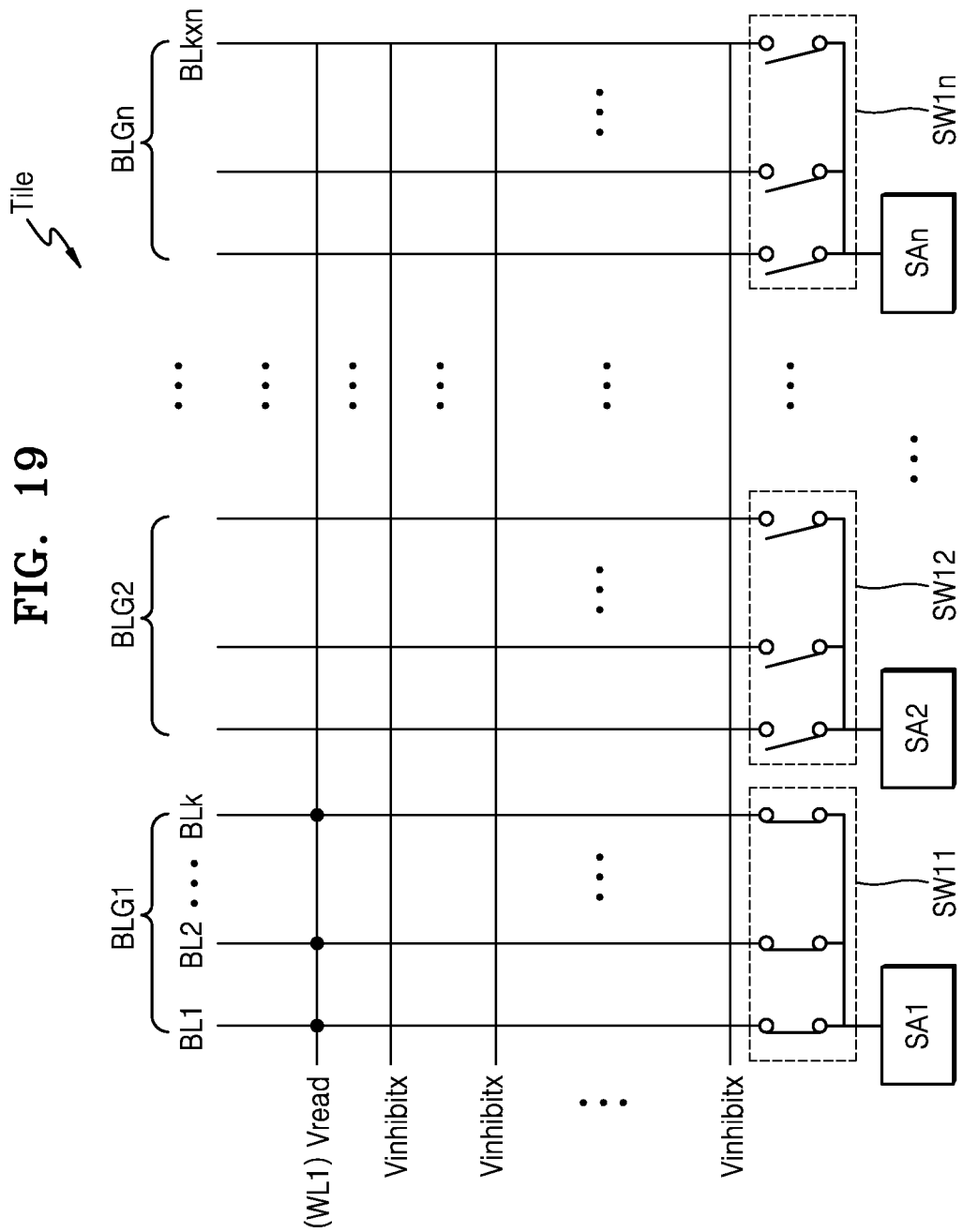

FIGS. 18 and 19 are circuit diagrams illustrating examples of a resistive memory device according to another exemplary embodiment. FIG. 18 illustrates an exemplary embodiment of the write drivers. FIG. 19 illustrates an exemplary embodiment of the sense amplifiers. Also, in FIGS. 18 and 19, the write drivers and the sense amplifiers are arranged with respect to one tile Tile. When the resistive memory device includes a plurality of tiles, additional write drivers and sense amplifiers may be further arranged correspondingly thereto.

As illustrated in FIG. 18, m-number of word lines WL1~WLm and k*n-number of bit lines BL1~BLk*n may be included in one the tile Tile. Also, k*n-number of bit lines BL1~BLk*n may be divided into n-number of bit line groups BLG1~BLGn. Each bit line group may include k-number of bit lines. For example, the first bit line group BLG1 may include the first to k-th bit lines BL1~BLk. Also, the n-number of write drivers WD1-WDn are arranged corresponding to n-number of bit line groups BLG1-BLGn. Accordingly, one write driver may be commonly connected to the k-number of bit lines. Also, n-number of switch groups SW1~SWn may be further included in the resistive memory device to control connection between the n-number of write drivers WD1~WDn and k*n-number of bit lines BL1~BLk*n.

In performing the reset write operation on the memory cells according the present exemplary embodiment, each write driver may simultaneously perform the reset write operation on the memory cells. When any one word line, for example, the second word line WL2, is selected, one write driver may be connected to the memory cells through the selected bit lines and the reset write operation may be performed on two or more memory cells through the selected bit lines. For example, as the first switch group SW1 is turned on, the first write driver WD1 may be connected to the memory cells arranged in regions where the second word line WL2 and the first to k-th bit lines BL1~BLk interest. The reset write operation may be simultaneously performed on the connected memory cells.

In the example of FIG. 18, in selecting a plurality of memory cells for the reset write operation, one word line and one bit line group are selected. The present exemplary embodiment is not limited thereto. For example, as two or more bit line groups or all bit line groups are selected, the reset write operation may be simultaneously performed on a greater number of memory cells. Also, although the characteristics that all switches included in one switch group are simultaneously turned on are described, only some switches in one switch group may be turned on. Also, two or more word lines may be simultaneously selected. In this case, even when only one bit line is selected, one write driver may simultaneously reset write a plurality of memory cells.

Alternatively, as illustrated in FIG. 19, n-number of sense amplifiers SA1~SAn are arranged corresponding to n-number of bit line groups BLG1~BLGn. Accordingly, one sense amplifier may be commonly connected to k-number of bit lines. Also, n-number of switch groups SW11~SW1$n$ may be further included in the resistive memory device to control a connection between n-number of sense amplifiers SA1~San and k*n-number of bit lines BL1~BLk*n. At least two memory cells may be simultaneously selected to perform the verify operation. In an example of FIG. 19, one word line, for example, the first word line WL1, is selected and also a plurality of bit lines BL1~BLk corresponding to any one sense amplifier, for example, the first sense amplifier SA1, are selected. However, the present exemplary embodiment is not limited thereto and thus the selection of the word lines and the bit lines to select a plurality of memory cells, on which the verify read operation is simultaneously performed, may be variously modified.

Figure 20:
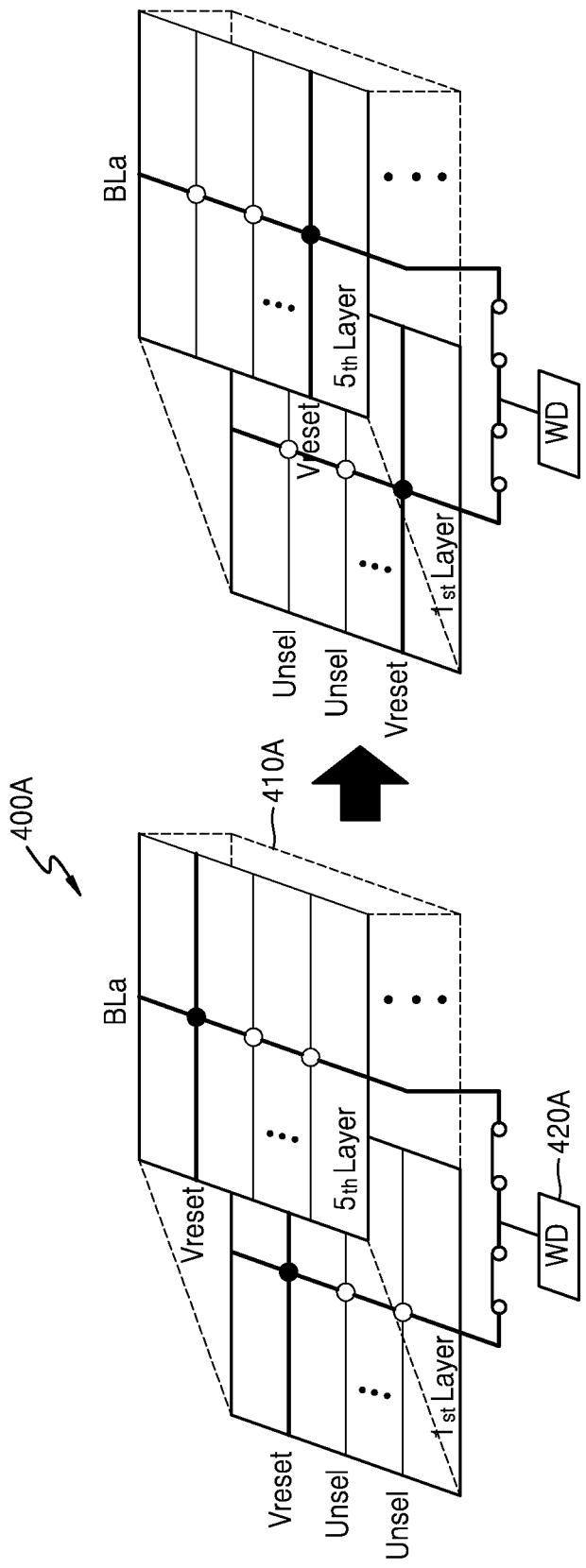
FIGS. 20 and 21 are block diagrams illustrating examples of resistive memory devices according to other exemplary embodiments.
Figure 21:
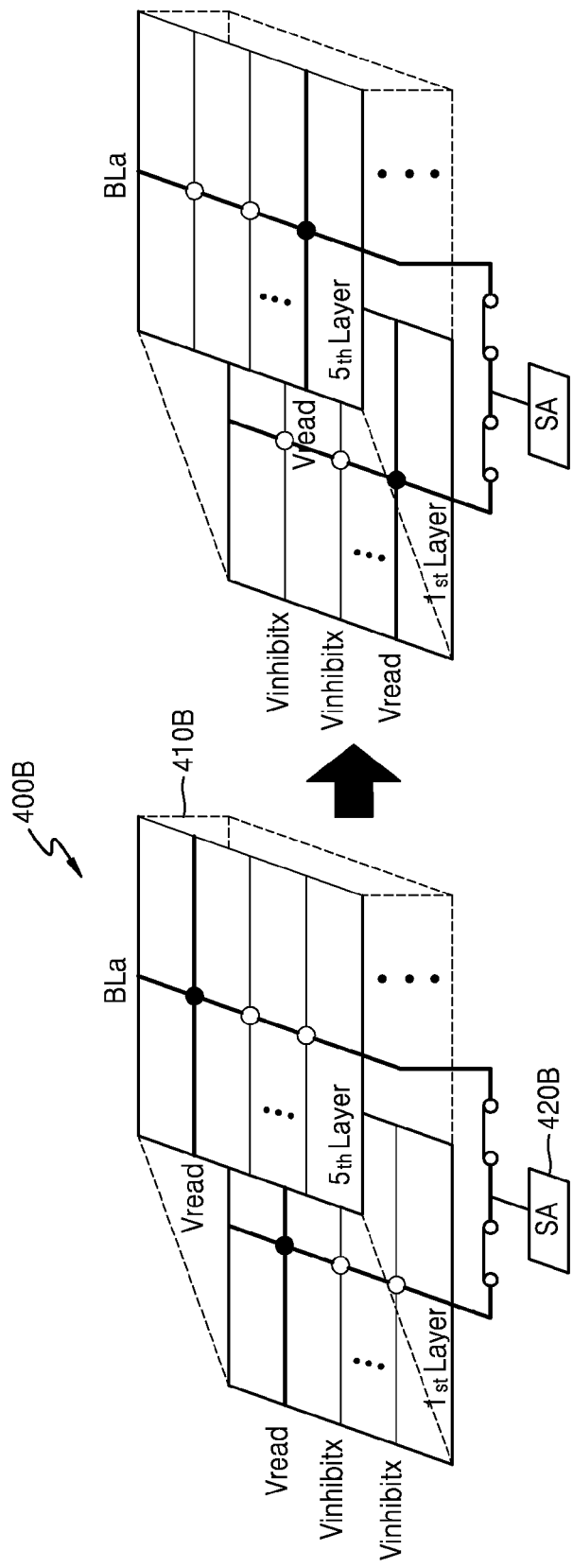

FIGS. 20 and 21 are block diagrams illustrating examples of resistive memory devices 400A and 400B according to other exemplary embodiments. In FIGS. 20 and 21, each of the resistive memory devices 400A and 400B includes a plurality of layers. FIG. 20 illustrates an example of the operation of a write driver 420A. FIG. 21 illustrates an example of the operation of a sense amplifier 420B. Also, in FIGS. 20 and 21, the write driver 420A and the sense amplifier 420B are arranged with respect to one tile Tile. When each of the resistive memory devices 400A and 400B includes a plurality of tiles, additional write drivers and sense amplifiers may be further arranged corresponding thereto.

The memory cells included in a plurality of layers may be defined to be one tile Tile 410A. For example, as illustrated in FIG. 20, the resistive memory device 400A includes five layers 1st Layer-5th Layer, each tile Tile may include memory cells of five layers 1st Layer-5th Layer. The write driver WD 420A may be commonly connected to bit lines of the layers. Although FIG. 20 illustrates only one write driver 420A that is commonly connected to an a-th bit line BLa of each of the five layers 1st Layer-5th Layer, this is merely for convenience of explanation, actually, a plurality of write drivers may be arranged corresponding to a plurality of bit lines. Also, the connection between the write driver 420A and the bit lines may be variously modified. For example, according to the above-described exemplary embodiment, the write driver 420A may be connected to the bit lines of one layer. Also, the write driver 420A may be arranged on any one of the layers.

In performing the erase operation according the present exemplary embodiment, word lines of a plurality of layers may be simultaneously selected. For example, as illustrated in FIG. 20, the first word line WL1 of each of the five layers 1st Layer~5th Layer may be simultaneously selected. Also, at least one of bit lines of the five layers 1st Layer-5th Layer may be selected. For example, an a-th bit line BLa of each of the five layers 1st Layer-5th Layer may be selected. Accordingly, the memory cells arranged in regions where the first word line WL1 and the a-th bit line BLa intersect may be selected from each layer. The write driver 420A may simultaneously reset-write the memory cells arranged on the five layers 1st Layer-5th Layer.

When the reset write operation on the memory cells of any one word line is completed, another word line is selected and the reset write operation may be performed thereon. FIG. 20 illustrates an example in which the first word line to the m-th word line WL1~WLm are sequentially selected. Accordingly, the m-th word line WLm and one or more bit lines of the five layers 1st Layer-5th Layer are selected and thus the reset operation may be simultaneously performed on the memory cells.

Similarly to the above, as illustrated in FIG. 21, the resistive memory device 400B may include a plurality of layers. One tile Tile 410B may include a memory cells arranged on the layers. Also, any one sense amplifier SA 420B may be commonly connected to one or more bit lines of the layers. Accordingly, the verify operation may be simultaneously performed on the memory cells. In the example of FIG. 21, in performing the verify operation, one word line and one bit line are selected from each layer, and read results from the memory cells of the layers are summed and provided to the sense amplifier SA 420B.

According to the exemplary embodiments of FIGS. 20 and 21, in performing the erase operation, each write driver simultaneously reset-writes at least two memory cells arranged on two or more layers. Also, each sense amplifier receives read results from at least two memory cells arranged on two or more layers and generates a verify result according thereto. However, the present exemplary embodiment is not limited thereto and the memory cells may be selected with respect to a plurality of layers in various methods. For example, in a manner that is the same as or similar to the above-described various exemplary embodiments, two or more word lines may be simultaneously selected from each layer. Also, two or more bit lines may be simultaneously selected.

Figure 22:
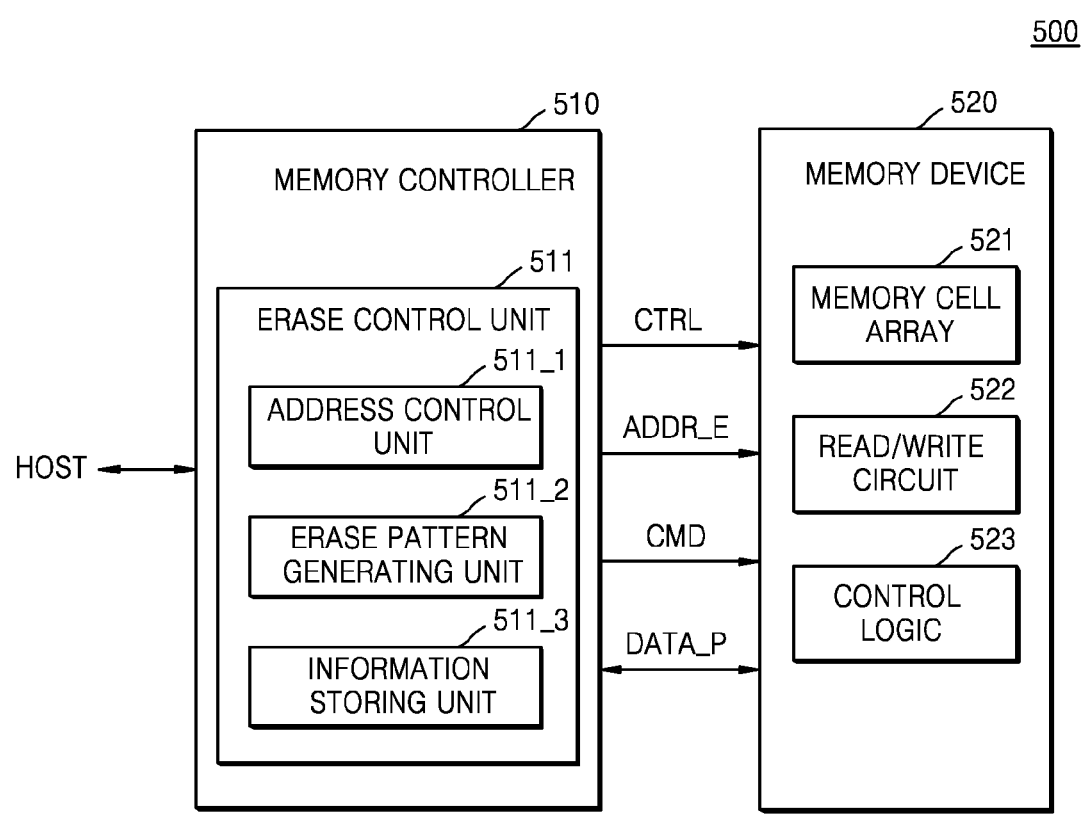
FIG. 22 is a block diagram of a memory system according to another exemplary embodiment.

FIG. 22 is a block diagram of a memory system 500 according to another exemplary embodiment. In FIG. 22, at least some of various functions to control the erase operation with respect to the memory cells are performed by a memory controller 510 according to the above-described exemplary embodiment.

As illustrated in FIG. 22, the memory system 500 may include the memory controller 510 and a memory device 520. Also, the memory controller 510 according the present exemplary embodiment may include an erase control unit 511 to control the erase operation with respect to the memory device 520. The erase control unit 511 may include an address control unit 511_1, an erase pattern generating unit 511_2, and an information storing unit 511_3. Also, the memory device 520 may include a memory cell array 521, a read/write circuit 522, and a control logic 523.

The memory controller 510, in response to write, read, and erase requests from the host HOST, may control the operation of the memory device 520 by generating a control signal CTRL and a command CMD. Alternatively, according to the above-described exemplary embodiment, the erase control unit 511 may control the erase operation with respect to the memory cell array. For example, the erase control unit 511 may control the erase operation such that at least two memory cells are simultaneously erased during the erase operation.

The address control unit 511_1 may perform various address control operations related to the erase operation. For example, by applying any one of the above-described exemplary embodiments, various pieces of information related to the selection of the memory cells during the erase operation may be stored in the information storing unit 511_3. During the erase operation, the address control unit 511_1 may generate an address ADDR_E indicating the memory cells to be erased, referring to the information stored in the information storing unit 511_3. In generating the address ADDR_E according to the above-described exemplary embodiment, the address ADDR_E may be generated such that one write driver of the memory device 520 simultaneously reset writes two or more memory cells or one sense amplifier simultaneously verifies two or more memory cells. In addition, the address control unit 511_1 may include an address information storing unit (not shown). When the memory cells in a region including at least one piece of valid data is erased, an address conversion operation may be performed to move the valid data to another position in the memory cell array 521.

Alternatively, in order to control the erase operation, the memory controller 510 may provide a data pattern Data_P to be provided to a selected memory cell, with the address ADDR_E indicating the memory cells to be erased, to the memory device 520. For example, when the erase operation is performed by the reset write operation, the erase pattern generating unit 511_2 may generate a data pattern Data_P corresponding to the reset state and provide a generated data pattern to the memory device 520.

Alternatively, the memory controller 510 may control the memory device 520 to perform the erase operation according to an erase request from the host HOST. Also, when a write request is received from the host HOST, the memory controller 510 may control the memory device 520 to first perform the erase operation in units of memory cells or regions and then write actual data. Also, the memory controller 510 may determine the necessity of the erase operation, for example, the necessary of securing an erase area, regardless of the request from the host HOST. According to a determination result, the memory device 520 may be controlled to perform the erase operation.

Figure 23:
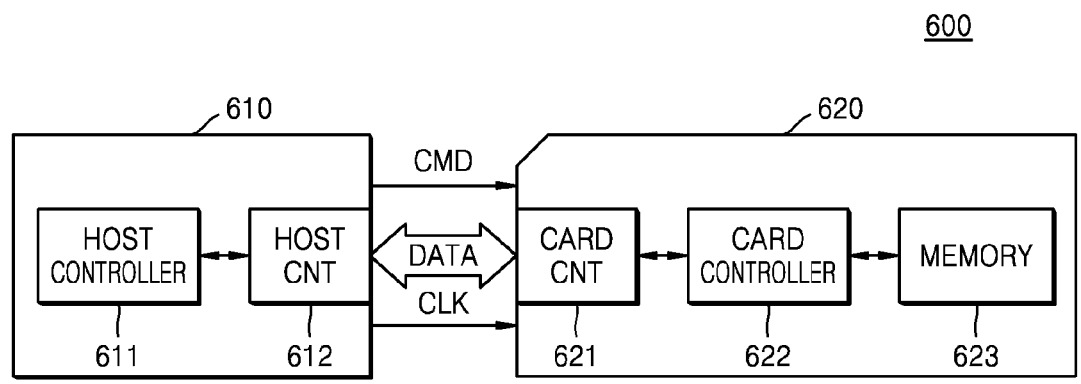
FIG. 23 is a block diagram illustrating an example of applying the memory system according to any one of the exemplary embodiments to a memory card system.

FIG. 23 is a block diagram illustrating an example of applying the memory system according to any one of the above-described exemplary embodiments to a memory card system 600. The memory system is assumed to be a resistive memory system.

Referring to FIG. 23, the memory card system 600 may include a host 610 and a memory card 620. The host 610 may include a host controller 611 and a host connector 612. The memory card 620 may include a card connector 621, a card controller 622, and a memory device 623. The memory device 623 may be embodied by using the exemplary embodiments illustrated in FIGS. 1 to 22. Accordingly, the memory device 623 may perform the erase and verify operations on the memory cells, and erase and verify a plurality of memory cells at the same time during the erase and verify operations.

The host 610 may write data to the memory card 620 or may read data stored in the memory card 620. The host controller 611 may transmit a command CMD, a clock signal CLK generated by a clock generator (not shown) in the host 610, and data DATA, to the memory card 620 via the host connector 612.

The card controller 622 in response to the command CMD received through the card connector 621 may store the data DATA in the memory device 623 in synchronism with the clock signal CLK generated by the clock generator in the card controller 622. The memory device 623 may store the data DATA transmitted from the host 610.

The memory card 620 may be embodied by a compact flash card (CFC), a microdrive, a smart media card (SMC), a multimedia card (MMC), a security digital card (SDC), a memory stick, a USB flash memory driver, etc.

Figure 24:
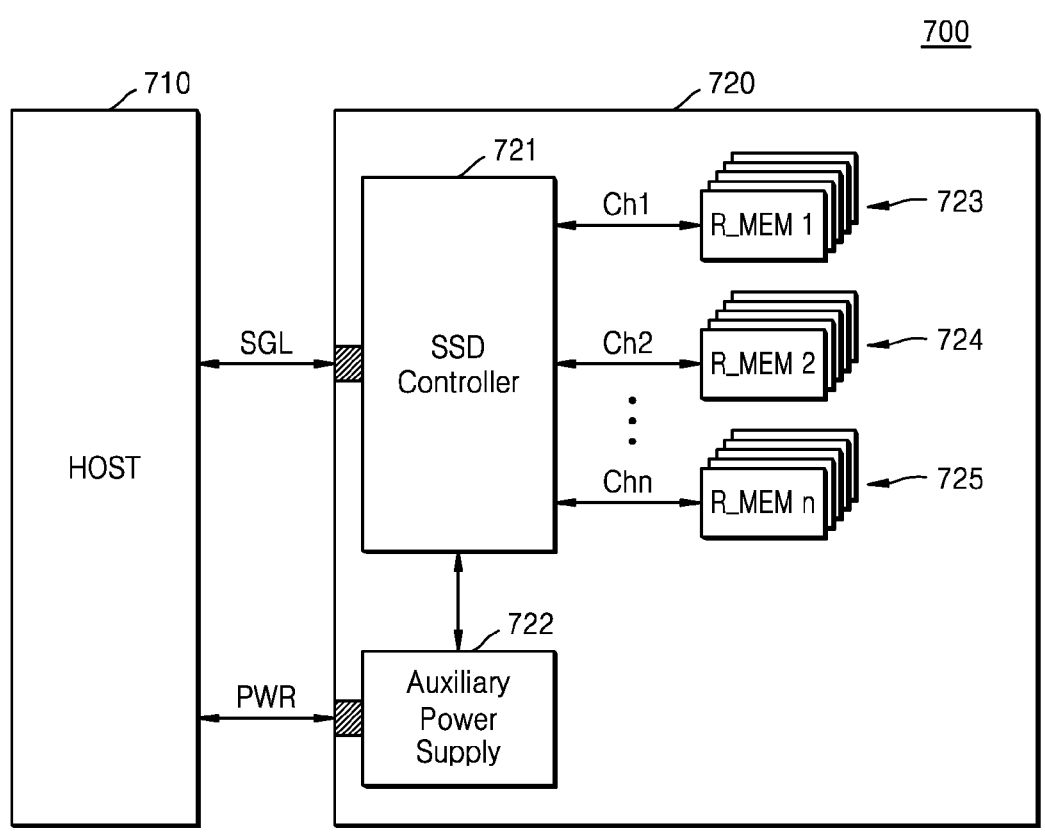
FIG. 24 is a block diagram illustrating an example of applying the memory system according to any one of the exemplary embodiments to a solid state drive (SSD) system.

FIG. 24 is a block diagram illustrating an example of applying the memory system according to any one of the above-described exemplary embodiments to a SSD system 700.

Referring to FIG. 24, the SSD system 700 may include a host 710 and an SSD 720. The SSD 720 may exchange signals with the host 710 via a signal connector (not shown) and may receive an input of power through a power connector (not shown). The SSD 720 may include an SSD controller 721, an auxiliary power supply 722, and a plurality of memory devices 723, 724, and 725. The SSD 720 may be embodied by using the exemplary embodiments illustrated in FIGS. 1 to 22. Accordingly, each of the memory devices 723, 724, and 725 may perform the erase and verify operations on the memory cells, and erase and verify a plurality of memory cells at the same time during the erase and verify operations.

Figure 25:
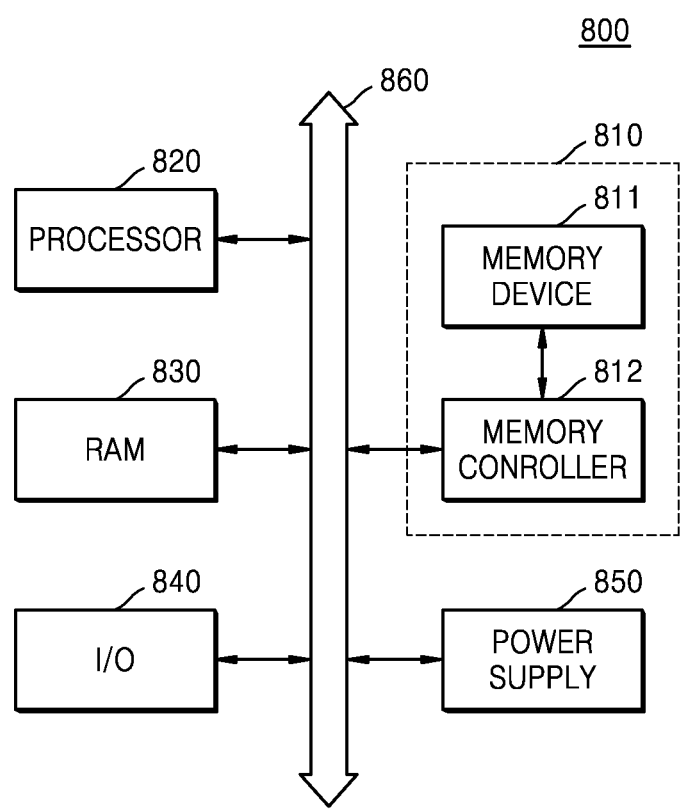
FIG. 25 is a block diagram of a computing system including the memory system according to any one of the exemplary embodiments.

FIG. 25 is a block diagram of a computing system 800 including a memory system 810 according to any one of the above-described exemplary embodiments. The memory system 810 is assumed to be a resistive memory system.

Referring to FIG. 25, the computing system 800 may include the memory system 810, a processor 820, RAM 830, an input/output (I/O) device 840, and a power supply 850. Also, the memory system 810 may include a memory device 811 and a memory controller 812. Alternatively, although it is not illustrated in FIG. 25, the computing system 800 may further include ports that may communicate with a video card, a sound card, a memory card, a USB device, etc. or other electronic devices. The computing system 800 may be embodied by a personal computer or a portable electronic apparatus such as a notebook computer, a mobile phone, a personal digital assistant (PDA), and a camera.

The processor 820 may perform particular calculations or tasks. In some exemplary embodiments, the processor 820 may be a micro-processor or a central processing unit (CPU). The processor 820 may perform communication with the RAM 830, the I/O device 840, and the memory system 810 via a bus 860 such as an address bus, a control bus, and a data bus. The memory system 810 and/or the RAM 830 may be embodied by using the resistive memory device illustrated in FIGS. 1 to 22.

According to an exemplary embodiment, the processor 820 may be connected to an extended bus such as a peripheral component interconnect (PCI) bus.

The RAM 830 may store data needed for the operation of the computing system 800. As described above, the memory device according to the present exemplary embodiment may be employed as the RAM 830. Alternatively, other memories such as dynamic RAM (DRAM), mobile DRAM, static RAM (SRAM), PRAM, ferroelectric RAM (FRAM), MRAM, etc. may be used as the RAM 830.

The I/O device 840 may include an input device such as a keyboard, a keypad, or a mouse, and an output device such as a printer or a display. The power supply 850 may supply an operating voltage needed for the operation of the computing system 800.

As described above, in the resistive memory device, the resistive memory system, and the method of operating a resistive memory device according to the present application, since a plurality of memory cells are simultaneously erased by one write driver, the time consumed by the verify operation may be reduced and performance of a memory may be improved.

Also, in the resistive memory device, the resistive memory system, and the method of operating a resistive memory device according to the present application, since a plurality of memory cells are simultaneously verified by one sense amplifier, the time consumed by the verify operation may be reduced and performance of a memory may be improved.

While the application has been particularly shown and described with reference to exemplary embodiments thereof, it will be understood that various changes in form and details may be made therein without departing from the spirit and scope of the following claims.

What is claimed is:

1. A method of operating a resistive memory device that includes a plurality of word lines and a plurality of bit lines, the method comprising:

selecting one or more first memory cells connected to a first bit line;
  selecting one or more second memory cells connected to a second bit line;
  simultaneously performing a reset write operation on the first and second memory cells using a first write driver;
  after performing the reset write operation, selecting two or more first memory cells connected to the first bit line;
  reading the two or more first memory cells and providing a plurality of read results to a first sense amplifier; and
  simultaneously verifying the first memory cells by using the first sense amplifier, wherein:
  memory cells arranged in regions where two or more word lines and a first bit line intersect are selected, and
  the read currents from the selected memory cells are provided to the first sense amplifier through the first bit line.

2. The method of claim 1, further comprising:
  receiving an erase command indicating an erase request, wherein
  the reset write operation is simultaneously performed on the first and second memory cells, in response to the erase command.

3. The method of claim 1, further comprising:
  receiving a write command indicating a data write request, wherein
  the reset write operation is simultaneously performed on the first and second memory cells, in response to the write command.

4. The method of claim 3, further comprising, after the simultaneous reset write operation is performed, performing a write operation using write data accompanying the write command.

5. The method of claim 1, wherein:
  the bit lines comprise 2*N-number of bit lines and N-number of write drivers are commonly connected to two bit lines and arranged corresponding to the 2*N-number of bit lines, wherein N is an integer greater than or equal to 1, and
  as all bit lines are simultaneously selected, all memory cells connected to one or more word lines are simultaneously reset-written.

6. The method of claim 1, wherein the reset write operation further comprises:
  simultaneously selecting at least two word lines, wherein
  the first write driver simultaneously performs the reset write operation on two or more first memory cells connected to the first bit line and two or more second memory cells connected to the second bit line.

7. The method of claim 1, further comprising:
  selecting one or more third memory cells connected to at least one of third to n-th bit lines of the plurality of bit lines, wherein
  the first write driver simultaneously performs the reset write operation on the first to third memory cells.

8. The method of claim 1, wherein:
  the resistive memory device comprises first and second layers, and
  the first bit line is arranged on the first layer and the second bit line is arranged on the second layer.

9. The method of claim 1, further comprising:
  after performing the reset write operation, reading the first and second memory cells and providing a plurality of results from reading the first and second memory cells to the first sense amplifier; and
  simultaneously verifying the first and second memory cells by using the first sense amplifier.

10. The method of claim 9, wherein a current flowing through the first memory cells and a current flowing through the second memory cells are summed and provided to the first sense amplifier.

11. The method of claim 9, wherein:
  at least two word lines are simultaneously selected, and
  the first sense amplifier simultaneously performs a verify operation on the two or more first memory cells connected to the first bit line and two or more second memory cells connected to the second bit line.

12. The method of claim 1, wherein:
  the resistive memory device stores information related to a selection of memory cells on which a previous reset write operation was simultaneously performed, and
  the method further comprises referring to the information to select the memory cells on which the reset write operation is simultaneously performed.

13. A method of operating a resistive memory device that includes a plurality of word lines and a plurality of bit lines, the method comprising:
  selecting two or more memory cells connected to one or more word lines or one or more bit lines;
  providing a signal obtained by summing read currents from the selected memory cells to a first sense amplifier; and
  generating a verify result by simultaneously verifying the selected two or more memory cells through the first sense amplifier, wherein:
  memory cells arranged in regions where two or more word lines and a first bit line intersect are selected, and
  the read currents from the selected memory cells are provided to the first sense amplifier through the first bit line.

14. The method of claim 13, wherein the generating of the verify result determines a pass or fail according to a result of comparing the signal obtained by summing the read currents with a reference current.

15. The method of claim 13, wherein:
  a second bit line also intersects the two or more word lines in the regions where the selected memory cells are arranged, and
  the read currents from the selected memory cells are provided to the first sense amplifier through the first and second bit lines.

16. The method of claim 13, wherein:
  the resistive memory device comprises first and second layers,
  the first sense amplifier receives the read currents through the first bit line and a second bit line, and
  the first bit line is arranged on the first layer and the second bit line is arranged on the second layer.

17. A method of operating a resistive memory device that includes a plurality of word lines and a plurality of bit lines, the method comprising:
  selecting one or more first memory cells connected to a first bit line;
  selecting one or more second memory cells connected to a second bit line; and
  simultaneously performing a reset write operation on the first and second memory cells using a first write driver, wherein:
  the resistive memory device stores information related to a selection of memory cells on which a previous reset write operation was simultaneously performed, and the method further comprises referring to the information to select the memory cells on which the reset write operation is simultaneously performed.

\* \* \* \* \*